US012525261B2

(12) United States Patent
Fujiwara et al.

(10) Patent No.: US 12,525,261 B2
(45) Date of Patent: Jan. 13, 2026

(54) MEMORY DEVICES WITH REDUCED BIT LINE CAPACITANCE AND METHODS OF MANUFACTURING THEREOF

(71) Applicant: Taiwan Semiconductor Manufacturing Company, Ltd., Hsinchu (TW)

(72) Inventors: Hidehiro Fujiwara, Hsinchu (TW); Chih-Yu Lin, Taichung (TW); Yuichiro Ishii, Yokohama (JP); Makoto Yabuuchi, Tokyo (JP); Masaya Hamada, Yokohama (JP); Koji Nii, Tokyo (JP); Yen-Huei Chen, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 226 days.

(21) Appl. No.: 18/453,634

(22) Filed: Aug. 22, 2023

(65) Prior Publication Data

US 2024/0371412 A1 Nov. 7, 2024

Related U.S. Application Data

(60) Provisional application No. 63/499,300, filed on May 1, 2023.

(51) Int. Cl.
*G11C 5/06* (2006.01)
*G11C 11/412* (2006.01)
*H10B 10/00* (2023.01)

(52) U.S. Cl.
CPC ............ *G11C 5/063* (2013.01); *G11C 11/412* (2013.01); *H10B 10/125* (2023.02)

(58) Field of Classification Search
CPC ......... G11C 5/063; G11C 11/412; G11C 7/18; G11C 8/14; H10B 10/125; H10B 10/12; H10B 80/00; H10D 89/10
See application file for complete search history.

(56) References Cited

U.S. PATENT DOCUMENTS 11,205,474 B1 * 12/2021 Yang ..................... G11C 11/412
2007/0041259 A1 * 2/2007 Terzioglu ............. G11C 29/026
365/208

(Continued)

FOREIGN PATENT DOCUMENTS

TW 201715655 A 5/2017
TW 201715703 A 5/2017

(Continued)

OTHER PUBLICATIONS

Office Action issued in connection with Taiwan Appl. No. 113103032 dated Jan. 14, 2025.

(Continued)

*Primary Examiner* — Huan Hoang
*Assistant Examiner* — Justin Bryce Heisterkamp
(74) *Attorney, Agent, or Firm* — FOLEY & LARDNER LLP

(57) ABSTRACT

A semiconductor device includes a first memory cell in a 4CPP architecture; a second memory cell formed in the 4CPP architecture and physically disposed next to the first memory cell along a first lateral direction; a first word line extending along the first lateral direction and operatively coupled to the first memory cell; a second word line extending along the first lateral direction and operatively coupled to the first memory cell; a third word line extending along the first lateral direction and operatively coupled to the second memory cell; a fourth word line extending along the first lateral direction and operatively coupled to the second memory cell; a first bit line extending along a second lateral (Continued)

direction perpendicular to the first lateral direction and operatively coupled to the first memory cell; and a second bit line extending along the second lateral direction and operatively coupled to the second memory cell.

20 Claims, 22 Drawing Sheets

(56) References Cited

U.S. PATENT DOCUMENTS

| | | | | |
|---|---|---|---|---|
| 2007/0127301 | A1* | 6/2007 | Nobutoki | G11C 7/18 365/202 |
| 2008/0013376 | A1* | 1/2008 | Sim | G11C 5/025 257/E27.11 |
| 2009/0323453 | A1* | 12/2009 | Rao | G11C 7/1012 365/230.02 |
| 2012/0224405 | A1* | 9/2012 | Tanaka | G11C 11/418 365/72 |
| 2016/0056161 | A1* | 2/2016 | Hong | H10B 10/12 257/401 |
| 2016/0064067 | A1* | 3/2016 | Mojumder | H10B 10/12 365/154 |
| 2017/0287553 | A1 | 10/2017 | Ishii | |
| 2019/0198507 | A1* | 6/2019 | Nii | G11C 11/412 |
| 2020/0219890 | A1* | 7/2020 | Chong | H10D 89/10 |
| 2020/0243131 | A1* | 7/2020 | Kohara | G11C 11/419 |
| 2021/0304815 | A1 | 9/2021 | Lai et al. | |
| 2021/0366915 | A1 | 11/2021 | Fujiwara et al. | |
| 2022/0076740 | A1 | 3/2022 | Yang et al. | |
| 2022/0310630 | A1 | 9/2022 | Wang et al. | |
| 2024/0040762 | A1* | 2/2024 | Liaw | H10B 10/125 |
| 2024/0096383 | A1* | 3/2024 | Liaw | G11C 7/1069 |
| 2024/0161819 | A1* | 5/2024 | Liaw | G11C 11/412 |

FOREIGN PATENT DOCUMENTS

| | | | |
|---|---|---|---|
| TW | 201740541 | A | 11/2017 |
| TW | 202020603 | A | 6/2020 |
| TW | 202315051 | A | 4/2023 |

OTHER PUBLICATIONS

Office Action issued in connection with Korean Appl. No. 10-2024-0055675 dated Feb. 6, 2025.

* cited by examiner

MEMORY DEVICES WITH REDUCED BIT LINE CAPACITANCE AND METHODS OF MANUFACTURING THEREOF

CROSS-REFERENCE TO RELATED APPLICATION

This application claims priority to and the benefit of U.S. Provisional Application No. 63/499,300, filed May 1, 2023, entitled "BITCELL WITH BL-C REDUCTION IN MEMORY DEVICE," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
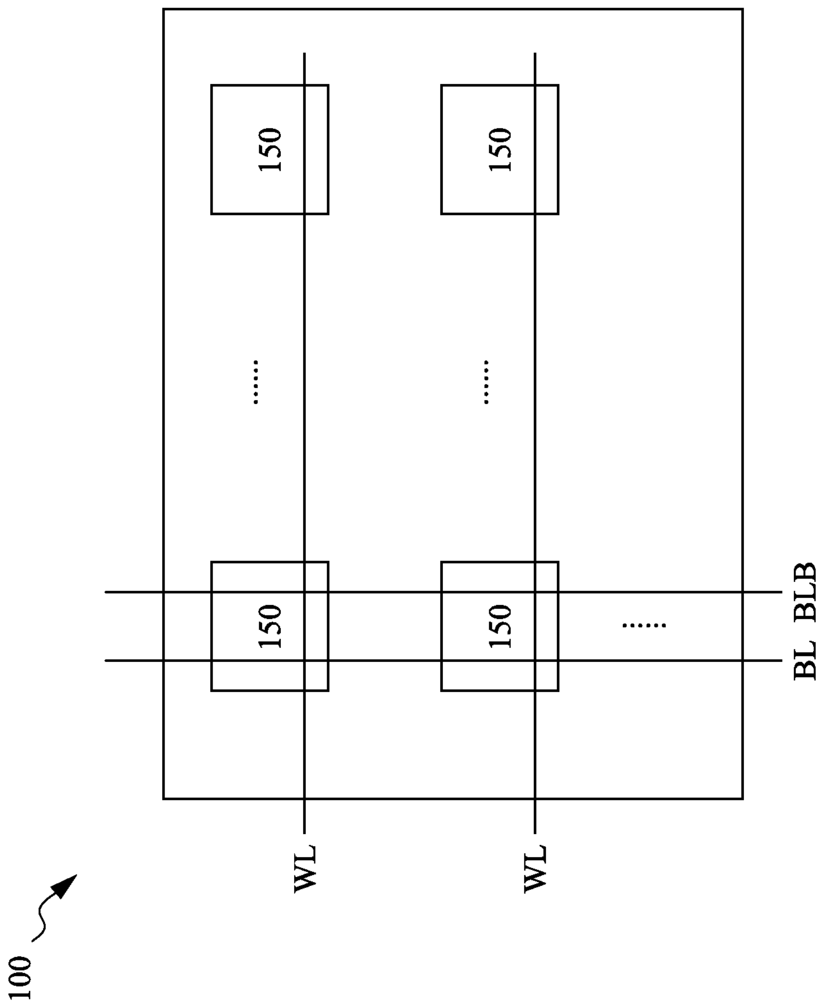
FIG. 1 illustrates a schematic diagram of an example memory array including a number of memory cells, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A common type of integrated circuit memory is a static random access memory (SRAM) device. A typical SRAM memory device has an array of memory cells, or "bit-cells." In some examples, each memory cell uses multiple (e.g., 6) transistors connected between an upper reference potential (typically referred to as VDD) and a lower reference potential (typically referred to as ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the bit cell to its bit lines.

Typically, an SRAM device has an array of memory cells that include transistors formed using a fin field effect transistor (FinFET) architecture or a gate-all-around (GAA) transistor architecture. For example in a FinFET architecture, a polysilicon/metal structure can be connected to a semiconductor fin that extends above an isolation material. The polysilicon/metal structure functions as the gate structure of a corresponding FinFET transistor such that a voltage applied to the gate structure determines the flow of electrons between source/drain (S/D) contacts connected to the fin on opposite sides of the gate structure. A threshold voltage of the FinFET transistor is the minimum voltage for the transistor considered to be turned "on" such that an appreciable current can flow between the S/D contacts. The number of gate structures in contact with a fin along its lengthwise direction that are used in forming a cell (e.g., an SRAM cell) can sometimes be referred to as a "pitch," a "contacted polysilicon pitch," or "CPP," of the SRAM cell along one dimension and is at least partially determinative of the density of the SRAM device.

For example, an SRAM cell (e.g., a six-transistor (6T) SRAM cell), formed in a two contacted poly pitch (2CPP) architecture, includes two pass gate transistors, two PMOS transistors, and two NMOS transistors. The transistors are collectively formed using a number of active regions (e.g., fins), the active regions having two gate structures (e.g., polysilicon or metal structures) connected thereto along its lengthwise direction and having a S/D contact connected to the active region between at least some of the gate structures. In the manufacture of typical 2CPP SRAM architectures, a process step requiring a cut of a portion of the fins in each cell is necessary to form an SRAM cell. In addition, the memory cells arranged along neighboring rows typically share the same source/drain contact structure, which disadvantageously limits the capability for independently controlling (e.g., accessing) one or more certain rows.

In this regard, a four contacted poly pitch (4CPP) architecture has been proposed to form an SRAM cell, which may include two pass gate transistors, two PMOS transistors, and two NMOS transistors for a 6T SRAM cell. All of the transistors are formed using a number of fins, in which four gate structures (e.g., polysilicon or metal structures) are connected to each of the fins along its corresponding lengthwise direction and having a S/D contact connected to the fin between at least some of the gate structures. Having four gate structure enables the SRAM cell to have a smaller height (along the lengthwise direction of a corresponding word line). Thus, the word line routing resistance to the farthest cell (e.g., the farthest bit) can be lower, resulting in less word line loading. Such a 4CPP architecture enables more space for routing in the lengthwise direction of the word line. Moreover, internal nodes of the SRAM cell in this 4CPP architecture can be coupled using various middle-end-of-line or back-end-of-line structures (e.g., VD, VG, and/or M0 layers) instead of using the cut process, which may save fabrication cost.

However, when forming a memory array including a number of these 4CPP SRAM cells, bit lines, formed to extend along another direction perpendicular to the lengthwise direction of the word lines, typically suffer high capacitance issues. For example, in an existing layout of such a memory array, the SRAM cells of each row that share the same word line are typically arranged along the lengthwise direction of the word lines, and neighboring rows of the memory array are typically arranged next to each other along lengthwise direction of the bit lines. As such, even-numbered rows and odd-numbered rows of the memory array are alternately arranged with one another along the lengthwise direction of the bit lines, which cause routing of the bit lines to become undesirably long (i.e., increased bit line capacitive loading). Thus, the existing SRAM devices have not been entirely satisfactory in some aspects.

The present disclosure provides various embodiments of a semiconductor (e.g., memory) device configured in a 4CPP architecture and designed to resolve the above-identified technical issues without compromising design constraints. For example, the disclosed memory device includes a memory array with a plural number of memory cells, each of the memory cells formed in a 4CPP architecture. The memory cells of the disclosed memory array may include a plural number of transistors, e.g., 7, 8, or 10. In a layout configuring an arrangement of the memory cells of the memory array, even-numbered rows and odd-numbered rows in a circuit diagram the memory array, when physically arranged in the layout, may be alternately arranged with respect to one another along the lengthwise direction of word lines (WLs). In this way, the extending length of bit lines (BLs) can be reduced. Further, along the lengthwise direction of the BLs, a plural number (M) of WL sets are arranged across a spacing of one unit of 4CPP, wherein each of the WL sets includes a plural number (N) of word lines. The effective CPP number may be reduced to 4/M accordingly. Alternatively stated, the disclosed memory array have its memory cells arranged with a pseudo-reduced 4CPP (e.g., pseudo 2 CPP) architecture. Additionally, by incorporating N word lines into each of the WL sets, a length of each of the BLs can be reduced by a factor of N (i.e., by 1/N). Thus, capacitive loading of the BLs can be significantly reduced.

FIG. 1 illustrates a schematic diagram of an example memory array 100, in accordance with some embodiments. As shown, the memory array 100 includes a number of memory cells 150, or bit-cells 150. One or more peripheral circuits (not shown) may be located at one or more regions peripheral to, or within, the memory array 100. The memory cell 150 and the periphery circuits may be operatively coupled by a number of bit lines (e.g., BL and BLB shown in FIG. 1), and data can read from and written to the memory cell 150 via such bit lines.

In various embodiments of the present disclosure, the memory cell 150 may be implemented as a Static Random Access Memory (SRAM) cell that is configured to be accessed (e.g., read, programmed) through a plural number of word lines (e.g., WLs shown in FIG. 1). In the following examples, the memory cell 150 may include seven transistors (sometimes referred to as a "7T SRAM") accessed through two word lines (e.g., 250 in FIG. 2), or eight transistors (sometimes referred to as an "8T SRAM") accessed through three word lines (e.g., 1550 in FIG. 15). However, it should be understood that the memory cell 150 can have any other number of transistors (e.g., 10 transistors), while remaining within the scope of the present disclosure.

Figure 2:
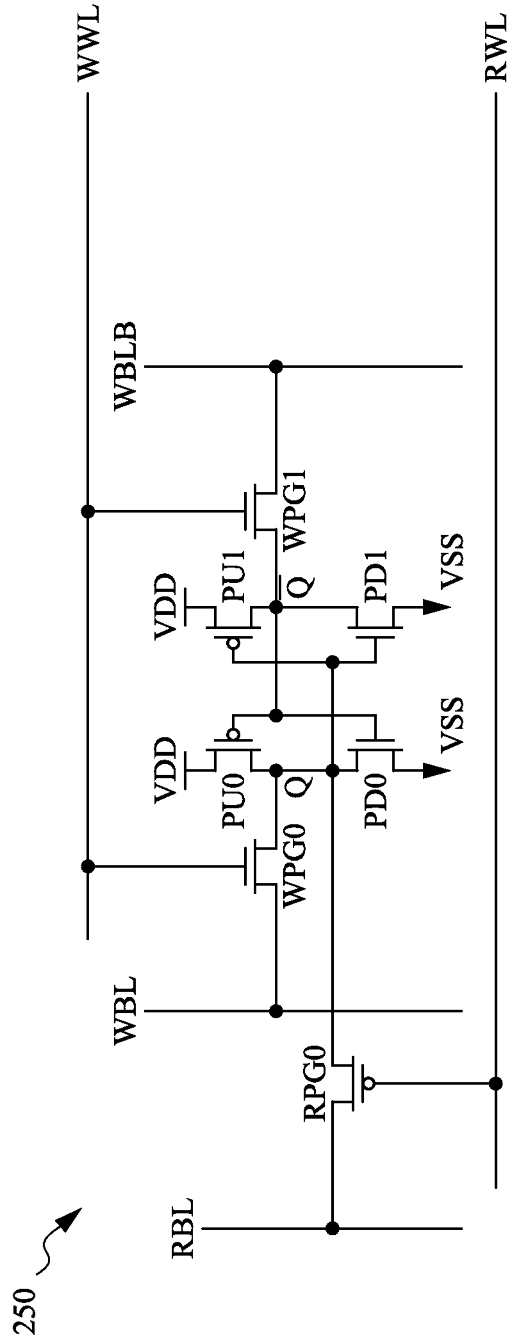
FIG. 2 illustrates an example circuit diagram of the memory cell of FIG. 1, in accordance with some embodiments.

FIG. 2 illustrates one example circuit diagram of the memory cell 150 shown in FIG. 1 (hereinafter "memory cell 250"), in accordance with some embodiments. As shown, the memory cell 250 consists of seven transistors: pull-up 0 transistor (PU0), pull-up 1 transistor (PU1), pull-down 0 transistor (PD0), pull-down 1 transistor (PD1), write pass gate 0 transistor (WPG0), write pass gate 1 transistor (WPG1), and read pass gate 0 transistor (RPG0), in which the transistors PU0, PU1, and RPG0 are each implemented as a p-type metal-oxide-semiconductor field-effect-transistor (MOSFET), and the transistors PD0, PD1, WPG0, and WPG1 are each implemented as an n-type MOSFET. However, it should be understood that these transistors can each be configured otherwise, while remaining within the scope of the present disclosure.

In general, the transistors PU0 and PD0 form a first invertor, and the transistors PU1 and PD1 form a second inverter. Such two inverters are cross-coupled to each other. Power is supplied to each of the inverters, for example, a first terminal of each of the transistors PU0 and PU1 is coupled to a power supply VDD, while a first terminal of each of transistors PD0 and PD1 is coupled to a reference voltage VSS, for example, ground. A bit of data is stored in the memory cell 250 as a voltage level at the node Q. The data stored at the node Q can be read by circuitry (e.g., a sense amplifier) via a read bit line RBL, which is enabled through the transistor RPG0 gate by a read word line RWL. Access (e.g., write operation) to the node Q is controlled by the transistor WPG0. The node Qbar stores the complement to value at Q, e.g., if Q is "high," Qbar is "low," and access to Qbar is controlled by the transistor WPG1. A gate of the transistor WPG0 is coupled to (e.g., controlled by) a write word line WWL. A first source/drain (S/D) terminal of the transistor WPG0 is coupled to a write bit line WBL, and a second S/D terminal of the transistor WPG0 is coupled to the second terminals of the transistors PU0 and PD0 at the node Q. Similarly, a gate of the transistor WPG1 is also coupled to the write word line WWL. A first S/D terminal of the transistor WPG1 is coupled to (e.g., controlled by) a complementary write bit line WBLB, and a second S/D terminal of the transistor WPG1 is coupled to second terminals of the transistors PU1 and PD1 at the node Qbar.

Figure 3:
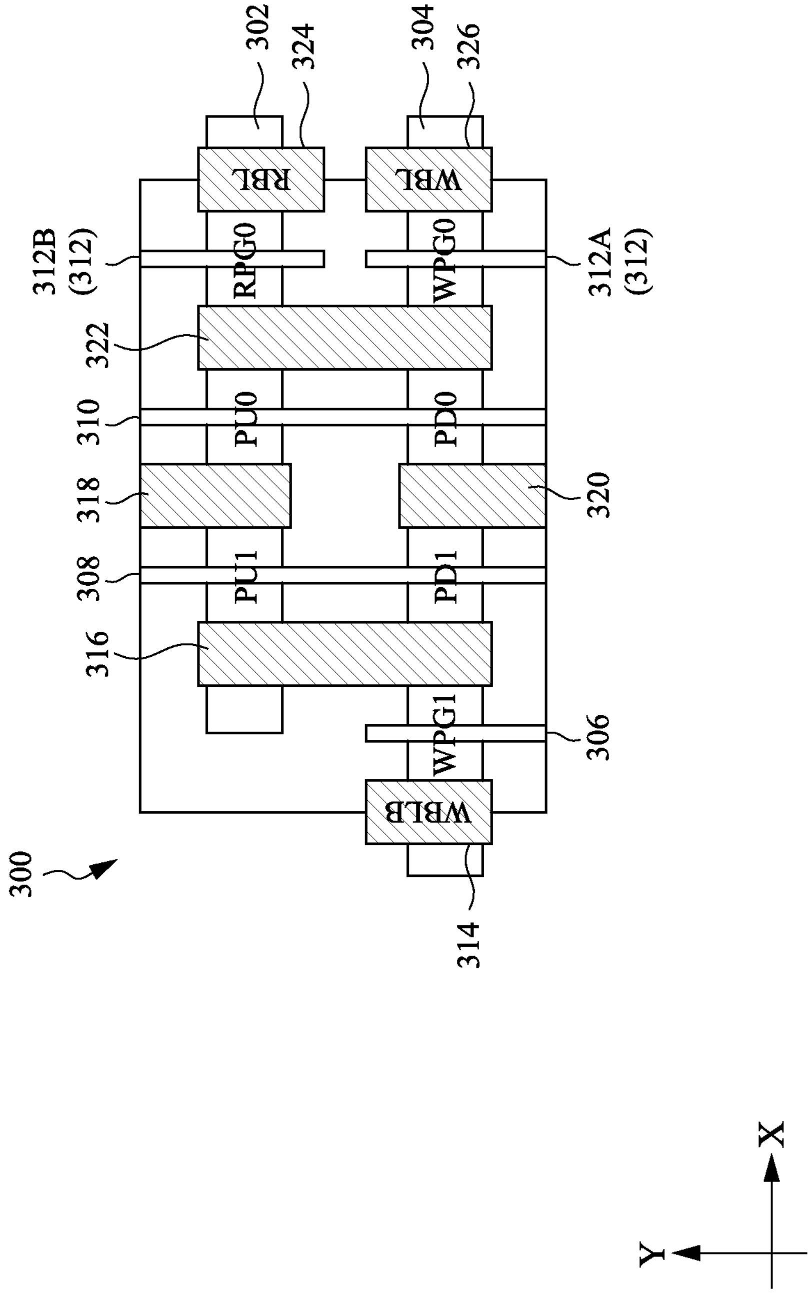
FIG. 3 illustrates an example layout corresponding to the memory cell shown in FIG. 2, in accordance with some embodiments.

FIG. 3 illustrates an example layout 300 corresponding to the memory cell 250 shown in FIG. 2, in accordance with some embodiments. The layout 300 may be used to fabricate the memory cell 250 as a number (e.g., 7) of nanostructure transistors (e.g., GAA transistors, etc.), in some embodiments. However, it is understood that the layout is not limited to fabricating nanostructure transistors. The layout 300 may be used to fabricate the memory cell 250 as any of various other types of transistors such as, for example, nanowire transistors, nanosheet transistors, FinFETs, etc., while remaining within the scope of the present disclosure. The components of the layout 300 are the same or are substantially similar to those depicted in FIG. 2, and thus, some of the reference numerals may be reused in the discussion of FIG. 3.

As shown, the layout 300 includes patterns 302 and 304 extending along a first lateral direction (e.g., the X direction), and patterns 306, 308, 310, and 312 extending along a second lateral direction (e.g., the Y direction). The patterns 302 and 304 are each configured to form an active region (e.g., a fin structure, a well, a protruding structure having alternately stacked silicon and silicon germanium layers, etc., which is sometimes referred to as an oxide diffusion (OD) region) over a substrate, and the patterns 306 to 312 are each configured to form a gate (e.g., a polysilicon gate, a metal gate, etc.) over the active regions. Accordingly, the patterns 302 and 304 may each be referred to as an active region, and the patterns 306 to 312 may each be referred to as a gate structure.

In some embodiments, the active region 304 may have n-type conductivity, and the active region 302 may have p-type conductivity. Based on the 4CPP architecture, each of the active regions 302 and 304 is traversed or otherwise overlaid by the four gate structures 306 to 312. Accordingly, the seven transistors, PD0, PD1, WPG0, WPG1, PU0, PU1, and RPG0, of the memory cell 250 (FIG. 2) can each be formed by a corresponding one of the active regions and a corresponding one of the gate structures, as shown in FIG. 3. For example, the transistor WPG1 can be formed by the active region 304 and the gate structure 306; the transistor PD1 can be formed by the active region 304 and the gate structure 308; the transistor PU1 can be formed by the active region 302 and the gate structure 308; the transistor PD0 can be formed by the active region 304 and the gate structure 310; the transistor PU0 can be formed by the active region 302 and the gate structure 310; the transistor WPG0 can be formed by the active region 304 and a first segment of the gate structure 312A; and the transistor RPG0 can be formed by the active region 302 and a second segment of the gate structure 312B.

The layout 300 further includes patterns configured to form a number of interconnect structures to operatively (e.g., electrically) couple the transistors PD0, PD1, WPG0, WPG1, PU0, PU1, and RPG0 to one another, forming the circuit shown in FIG. 2. For example, the layout 300 includes patterns 314, 316, 318, 320, 322, 324, and 326, each of which is configured to form a source/drain interconnect structure (e.g., sometimes referred to as a metal definition (MD) structure). The patterns 314 to 326 are hereinafter referred to as "MD 314," "MD 316," "MD 318," "MD 320," "MD 322," "MD 324," and "MD 326," respectively. These MDs 314 to 326 can extend along the lengthwise direction of the gate structures, in some embodiments. As such, the MDs 314 to 326 can electrically couple the different transistors of a memory cell to each other, couple one or more of the transistors to a corresponding access line (e.g., the WBLB, the RBL, the WBL), or couple one or more of the transistors to an interconnect structure carrying a supply voltage (e.g., VDD, ground). For example, the MD 314 can couple one of the S/D terminals of the transistor WPG1 to the WBLB; the MD 324 can couple one of the S/D terminals of the transistor RPG0 to the RBL; and the MD 326 can couple one of the S/D terminals of the transistor WPG0 to the WBL.

Figure 4:
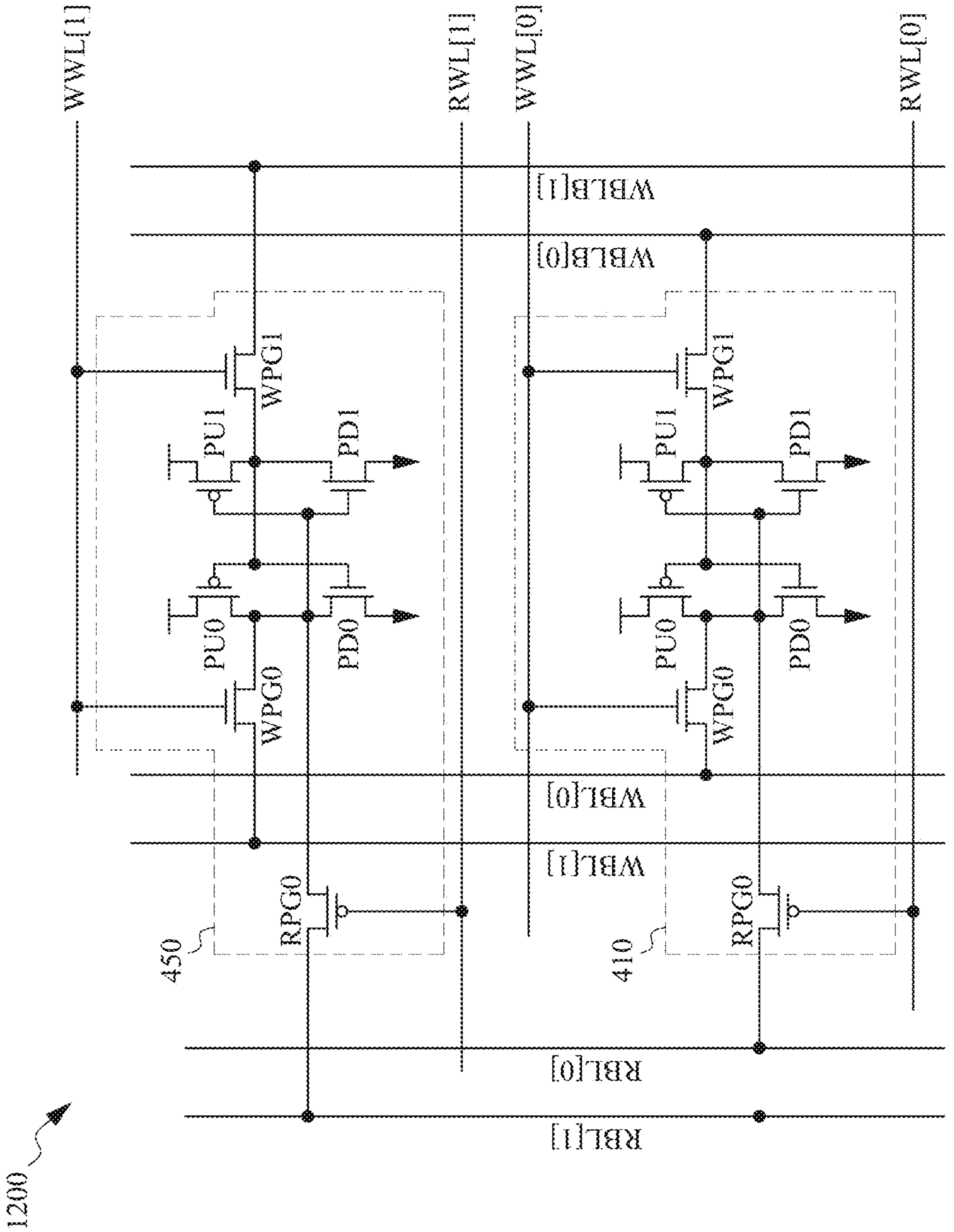
FIG. 4 illustrates an example circuit diagram of a portion of a memory array including the memory cells shown in FIG. 2, in accordance with some embodiments.

FIG. 4 illustrates an example circuit diagram of a portion of a memory array 400 that includes memory cells 410 and 450, in accordance with some embodiments. Each of the memory cells 410 and 450 is substantially similar to the memory cell 250 (FIG. 2), e.g., consisting of seven transistors (PD0, PD1, WPG0, WPG1, PU0, PU1, and RPG0). Further, in the example of FIG. 4, each of the memory cells 410 and 450 is accessed through a corresponding set of three bit lines, e.g., RBL, WBL, and WBLB, and a corresponding set of two word lines, e.g., WWL and RWL.

In some embodiments, the memory cells 410 and 450 may correspond to two adjacent cells disposed in a single "circuit column" of the memory array 400. The term "circuit column," as used herein, may refer to one of a plurality of symbolic columns within the circuit or schematic diagram of a memory array. Further, in the example of FIG. 4, the memory cells 410 and 450 may correspond to respectively different sets of bit lines and different sets of word lines. For example, the memory cell 410 can be accessed through WWL[0], RWL[0], WBL[0], WBLB[0], and RBL[0]; and the memory cell 450 can be accessed through WWL[1], RWL[1], WBL[1], WBLB[1], and RBL[1].

Figure 5:
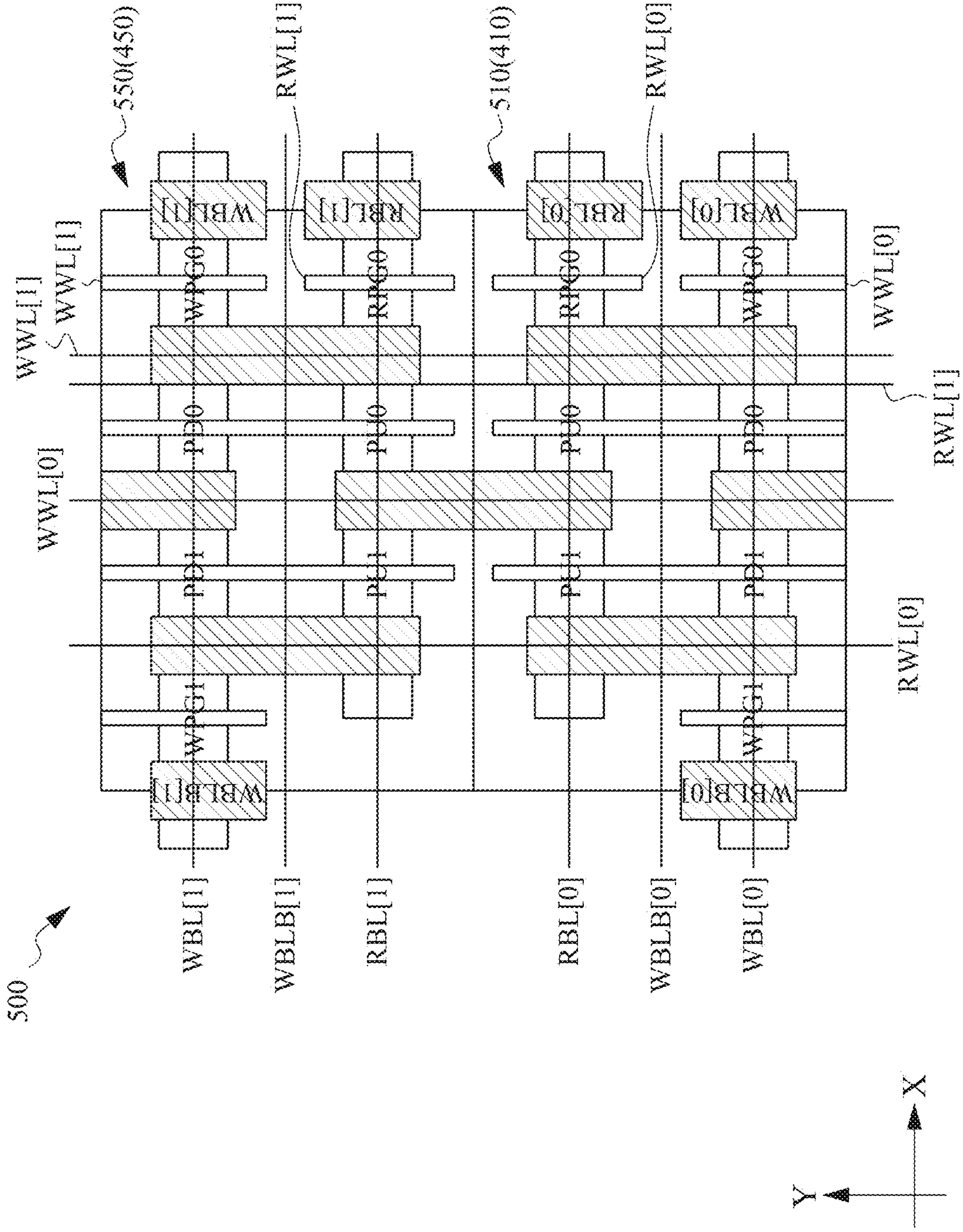
FIG. 5 illustrates an example layout corresponding to the memory array shown in FIG. 4, in accordance with some embodiments.

FIG. 5 illustrates an example layout 500 corresponding to the memory cells 410 and 450 shown in FIG. 4, in accordance with some embodiments. The layout 500 includes a first portion 510 and a second portion 550 corresponding to the memory cells 410 and 450, respectively. In some embodiments, the layout portions 510 and 550 are arranged next to each other along the Y direction. Each of the layout portions 510 and 550 is substantially similar to the layout 300 (FIG. 3). Thus, the following discussion of the layout 500 will be focused on the difference, e.g., how the respective access lines WWL[0], RWL[0], WBL[0], WBLB[0], RBL[0], WWL[1], RWL[1], WBL[1], WBLB[1], and RBL [1] are arranged.

In various embodiments, the gate structures of the transistors WPG0 and RPG0 of the memory cell 450 and the gate structure of the transistors WPG0 and RPG0 of the memory cell 410 may be aligned along the Y direction. The gate structure of the transistors WPG0 and RPG0 of the memory cell 410 and the gate structures of the transistors WPG0 and RPG0 of the memory cell 450, are coupled to the WWL[0], RWL[0], RWL[1], and WWL[1], respectively, as indicated in FIG. 5. These word lines WWL[0], RWL[0], RWL[1], and WWL[1] may be formed as conductive (e.g., metal) structures or lines disposed across one or more metallization (or back-end-of-line) layers. In some embodiments, the WWL[0], RWL[0], RWL[1], and WWL[1] may extend along the Y direction, as shown in FIG. 5. However, it should be understood that the WWL[0], RWL[0], RWL[1], and WWL[1] of FIG. 5 are provided for illustrating their relative arrangement. The sequence of the WWL[0], RWL [0], RWL[1], and WWL[1] may be adjusted according to various design constraints. Further, each of the WWL[0], RWL[0], RWL[1], and WWL[1] may be in electrical connection with the corresponding gate structure through one or more conductive lines and one or more vias disposed therebetween. Such interposed conductive lines/vias are not illustrated in FIG. 5 for clarity purposes.

In various embodiments, the MDs (filled with a pattern of diagonal stripes) of the transistors WPG0, WPG1, and RPG0 of the memory cell 410 and the transistors WPG0, WPG1, and RPG0 of the memory cell 450 are coupled to the WBL[0], WBLB[0], RBL[0], WBL[1], WBLB[1], and RBL [1], respectively, as indicated in FIG. 5. These bit lines WBL[0], WBLB[0], RBL[0], WBL[1], WBLB[1], RBL[1] may be formed as conductive (e.g., metal) structures or lines disposed across one or more metallization (or back-end-of-line) layers. In some embodiments, the WBL[0], WBLB[0], RBL[0], WBL[1], WBLB[1], and RBL[1] may extend along the X direction, as shown in FIG. 5. Similarly, it should be understood that the WBL[0], WBLB[0], RBL[0], WBL[1], WBLB[1], and RBL[1] of FIG. 5 are provided for illustrating their relative arrangement. The sequence of the WBL[0], WBLB[0], RBL[0], WBL[1], WBLB[1], and RBL[1] may be adjusted according to various design constraints. Further, each of the WBL[0], WBLB[0], RBL[0], WBL[1], WBLB [1], and RBL[1] may be in electrical connection with the corresponding S/D terminal through one or more conductive lines and one or more vias disposed therebetween. Such interposed conductive lines/vias are not illustrated in FIG. 5 for clarity purposes.

Figure 20:
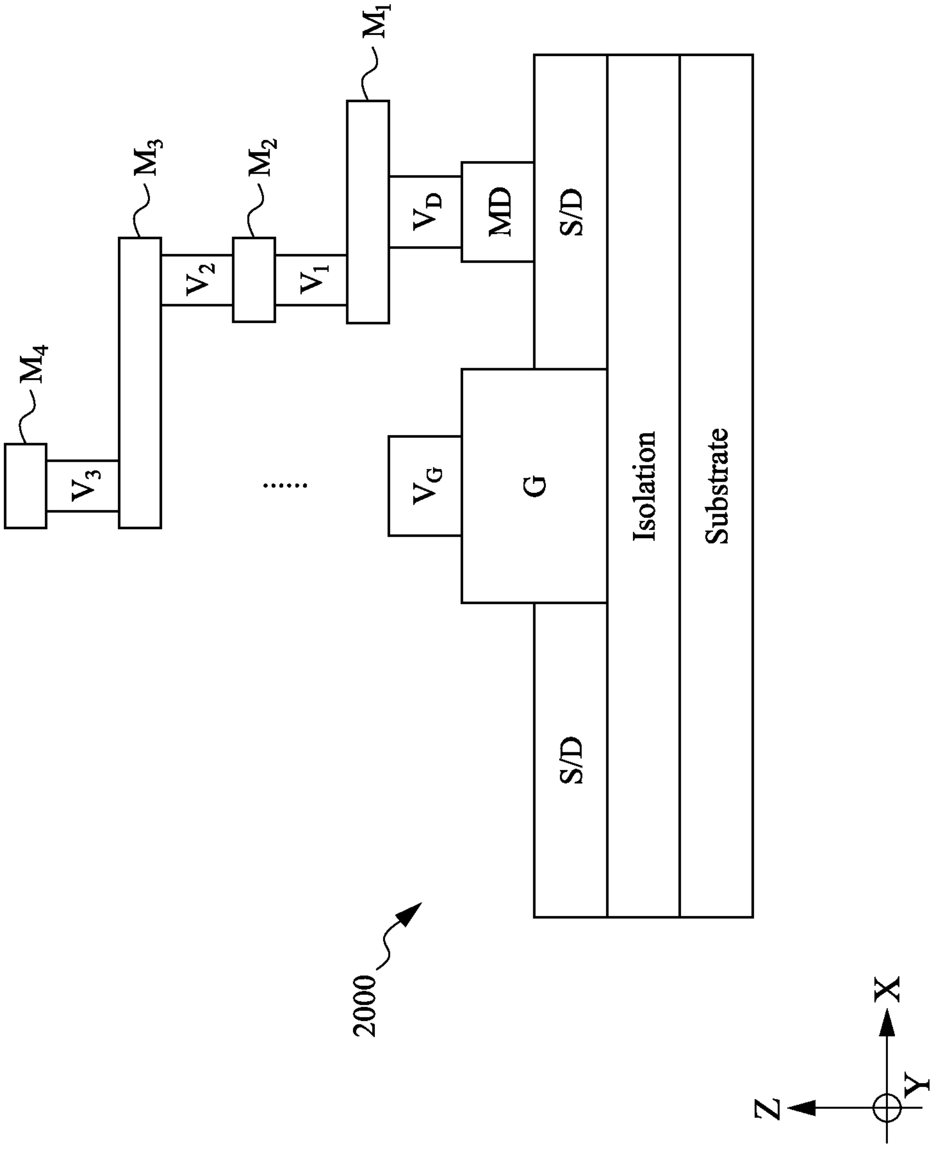
FIG. 20 illustrates a cross-sectional view of a semiconductor device, in accordance with some embodiments.

As a non-limiting example, the RBL[1] and RBL[0] may be formed as respective conductive lines in a first metallization layer (e.g., M1 layer shown in FIG. 20); the WWL[1] and WWL[0] may be formed as respective conductive lines in a second metallization layer (e.g., M2 layer shown in FIG. 20); the WBL[1], WBLB[1], WBL[0], and WBLB[0] may be formed as respective conductive lines in a third metallization layer (e.g., M3 layer shown in FIG. 20); and the RWL[1] and RWL[0] may be formed as respective conductive lines in a fourth metallization layer (e.g., M4 layer shown in FIG. 20).

Figure 6:
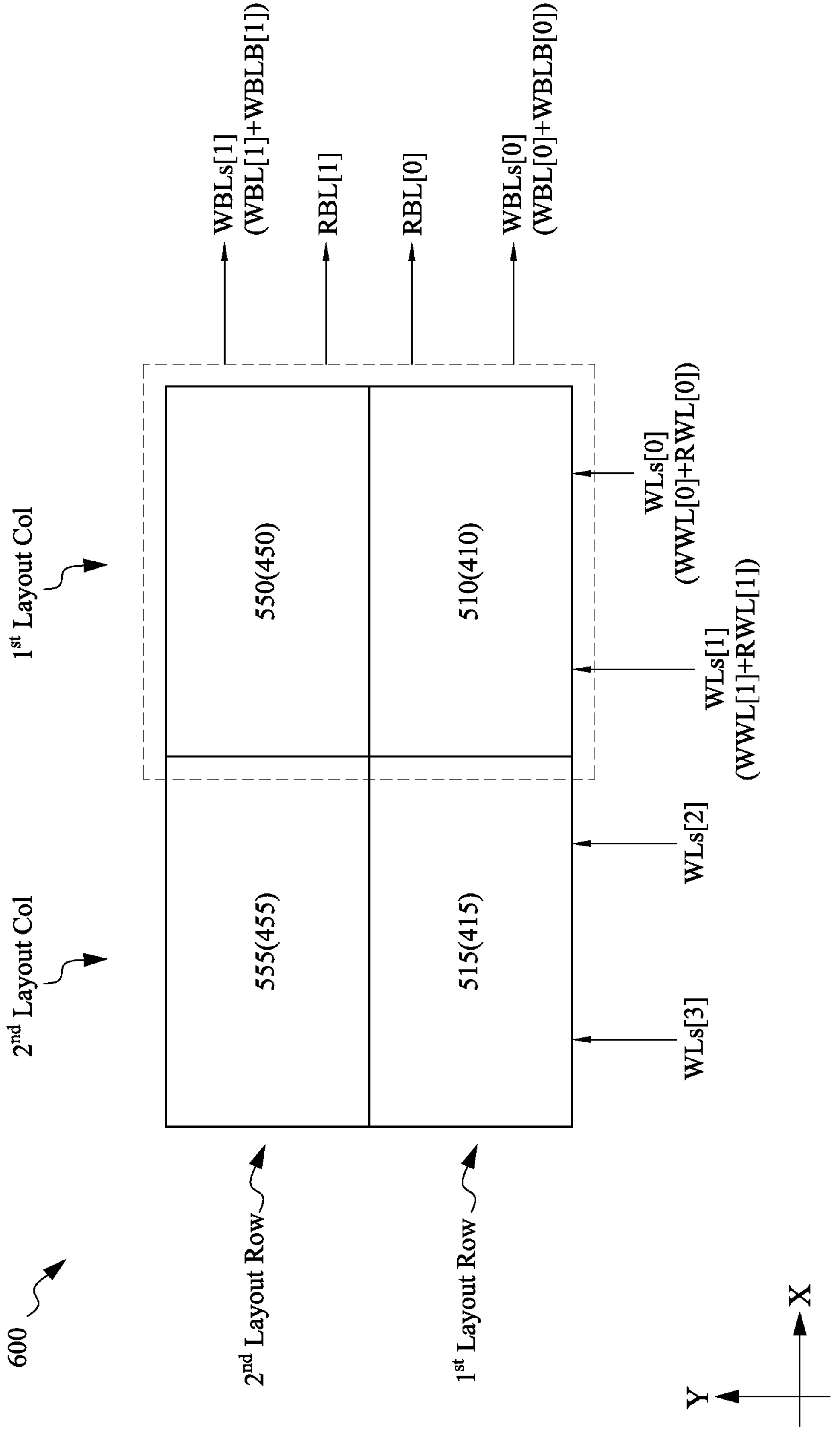
FIG. 6 illustrates a floorplan configured based on the layout of FIG. 5, in accordance with some embodiments.

FIG. 6 illustrates a schematic floorplan 600 corresponding to the layout 500 (FIG. 5), in accordance with some embodiments. The floorplan 600 may represent a physical arrangement, or layout, of multiple memory cells. In addition to the layout portions 510 and 550, the floorplan 600 includes other layout portions 515 and 555 that correspond to other two memory cells, respectively. The layout portions 515 and 555 are disposed next to each other along the Y direction, in which the layout portions 515 and 555 are disposed next to the layout portions 510 and 550 along the X direction, respectively.

Specifically, along a first "layout column" of the floorplan 600, the layout portions 510 and 550 are disposed next to each other; along a second "layout column" of the floorplan 600, the layout portions 515 and 555 are disposed next to each other; along a first "layout row" of the floorplan 600, the layout portions 510 and 515 are disposed next to each other; and along a second "layout row" of the floorplan 600, the layout portions 550 and 555 are disposed next to each other. The term "layout column" and "layout row," as used herein, may refer to one of a plurality of physical columns and one of a plurality of physical rows of an actually fabricated memory array, respectively. Memory cells, 415 and 455 (indicated in FIG. 6), corresponding to the layout portions 515 and 555 may be disposed in the same circuit column of the memory array 400 (FIG. 4). Thus, four adjacent memory cells along a single circuit column and respective circuit rows of the memory array may be physically arranged across two layout columns and two layout rows, as shown in FIG. 6.

For example, in a circuit/schematic diagram of the memory array (e.g., FIG. 1), the memory cells 410, 450, 415, and 455 may be arranged along a single circuit column and across a first circuit row, a second circuit row, a third circuit row, and a fourth circuit row, respectively. The first circuit row (e.g., row[0]) and third circuit row (e.g., row[2]) may sometimes be referred to as even-numbered rows, and the second circuit row (e.g., row[1]) and four circuit row (e.g., row[3]) may sometimes be referred to as odd-numbered rows, according to some embodiments. In the floorplan 600, the memory cell 410 is disposed at an intersection of the first layout row and the first layout column; the next memory cell 450 (in the circuit diagram) is disposed at an intersection of the second layout row and the first layout column; the next memory cell 415 (in the circuit diagram) is disposed at an intersection of the first layout row and the first layout column; and the next memory cell 455 (in the circuit diagram) is disposed at an intersection of the second layout row and the second layout column. Such a 2×2 checkboard-based floorplan can be used a basis to form a bigger memory array. For example, at least one floorplan similar to the floorplan 600 (representing one even-numbered row of memory cells and one odd-numbered row of memory cells) can be placed above or below the floorplan 600 in the Y direction, thereby forming a 2×4 memory array.

Referring still to FIG. 6, in such an arrangement, each layout column may include a plural number (e.g., 2) of WL sets, each of which includes another plural number (e.g., 2) of WLs, in some embodiments. For example, the first layout column of the floorplan 600 has WL sets, WLs[0] and WLs[1], and the second layout column of the floorplan 600 has WL sets, WLs[2] and WLs[3]. The WL set, WLs[0], can correspond to (e.g., be operatively coupled to) the memory cell 410; the WL set, WLs[1], can correspond to (e.g., be operatively coupled to) the memory cell 450; the WL set, WLs[2], can correspond to (e.g., be operatively coupled to) the memory cell 415; and the WL set, WLs[3], can correspond to (e.g., be operatively coupled to) the memory cell 455. Further, the WLs[0] has WWL[0] and RWL[0] coupled to the memory cell 410, and the WLs[1] has WWL[1] and RWL[1] coupled to the memory cell 450.

With each of the WL set having a plural number (N) of WLs, a length of each BL of the floorplan 600 can be reduced by a factor of N, i.e., the length of each BL of the floorplan 600 is inversely proportional to the number N. For example, the first layout row of the floorplan 600 includes WBL[0], WBLB[0], and RBL[0] that correspond to the memory cell 410; and the second layout row of the floorplan 600 includes WBL[1], WBLB[1], and RBL[1] that correspond to the memory cell 450. According to some embodiments of the present disclosure, by having 2 WLs in each WL set, a length of each of the WBL[0], WBLB[0], RBL[0], WBL[1], WBLB[1], and RBL[1] can be reduced by ½.

Figure 7:
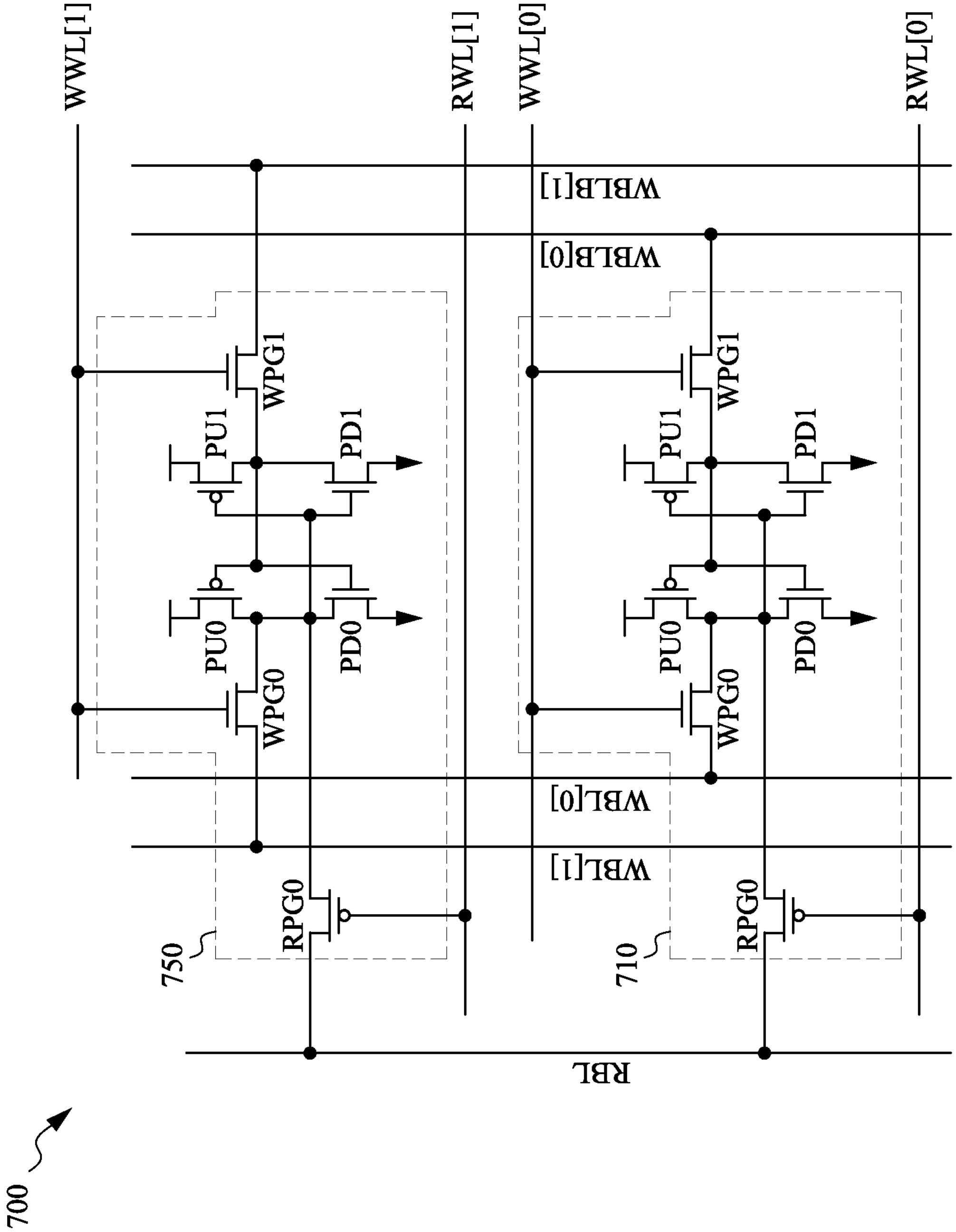
FIG. 7 illustrates an example circuit diagram of a portion of a memory array including the memory cells shown in FIG. 2, in accordance with some embodiments.

FIG. 7 illustrates an example circuit diagram of a portion of another memory array 700 that includes memory cells 710 and 750, in accordance with some embodiments. Each of the memory cells 710 and 750 is substantially similar to the memory cell 250 (FIG. 2), e.g., consisting of seven transistors (PD0, PD1, WPG0, WPG1, PU0, PU1, and RPG0). Further, in the example of FIG. 7, each of the memory cells 710 and 750 is accessed through a corresponding set of one bit line, e.g., WBL, and a corresponding set of two word lines, e.g., WWL and RWL, where the memory cells 710 and 750, nevertheless, may share a common bit line, e.g., RBL.

In some embodiments, the memory cells 710 and 750 may correspond to two adjacent cells disposed in a single circuit column of the memory array. In the example of FIG. 7, the memory cells 710 and 750 may correspond to respectively different sets of bit lines and different sets of word lines. For example, the memory cell 710 can be accessed through WWL[0], RWL[0], WBL[0], WBLB[0], and the shared RBL; and the memory cell 750 can be accessed through WWL[1], RWL[1], WBL[1], WBLB[1], and the shared RBL.

Figure 8:
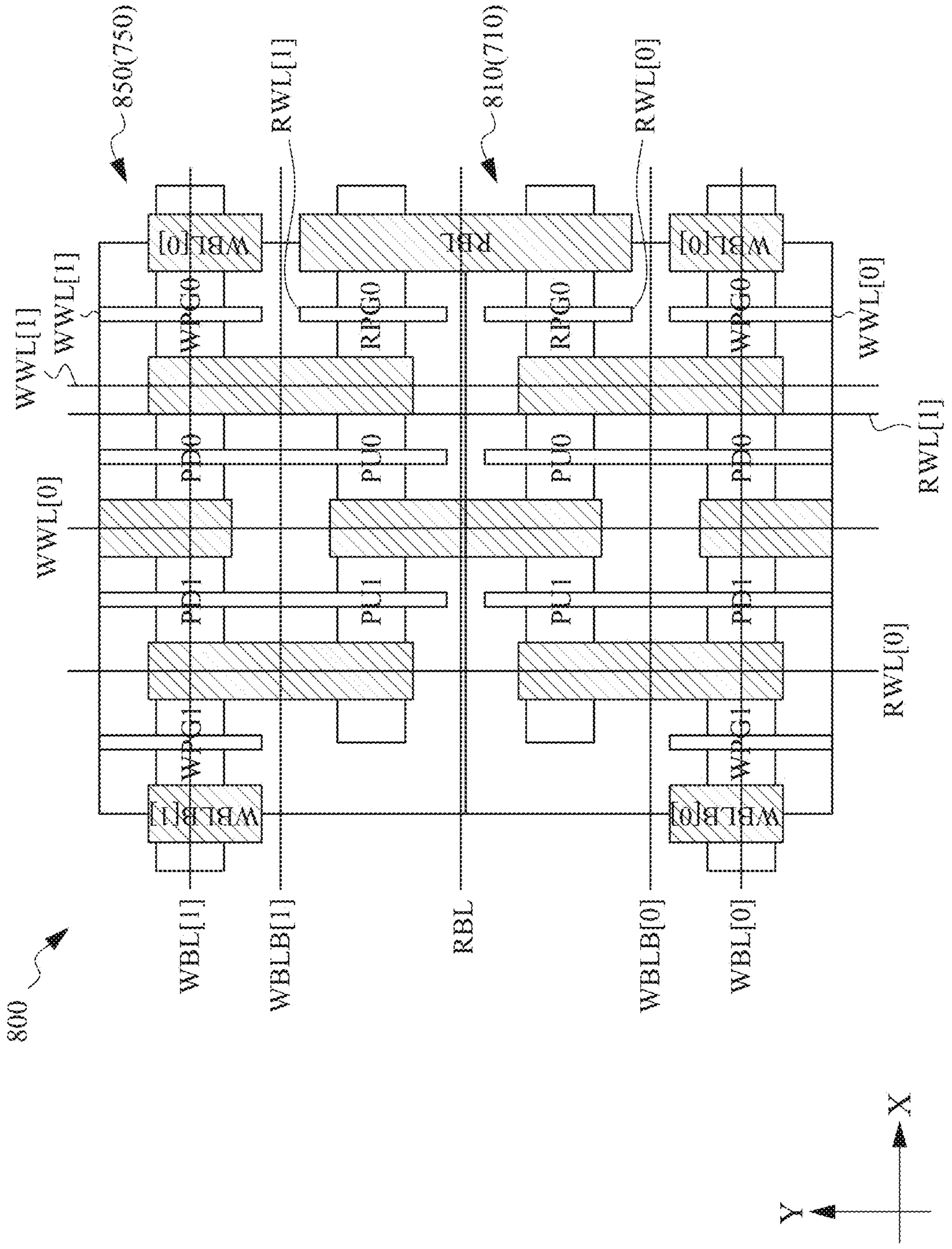
FIG. 8 illustrates an example layout corresponding to the memory array shown in FIG. 7, in accordance with some embodiments.

FIG. 8 illustrates an example layout 800 corresponding to the memory cells 710 and 750 shown in FIG. 7, in accordance with some embodiments. The layout 800 includes a first portion 810 and a second portion 850 corresponding to the memory cells 710 and 750, respectively. In some embodiments, the layout portions 810 and 850 are arranged next to each other along the Y direction. Each of the layout portions 810 and 850 is substantially similar to the layout 300 (FIG. 3). Thus, the following discussion of the layout 800 will be focused on the difference, e.g., how the respective access lines WWL[0], RWL[0], WBL[0], WBLB[0], WWL[1], RWL[1], WBL[1], WBLB[1], and RBL are arranged.

In various embodiments, the gate structures of the transistors WPG0 and RPG0 of the memory cell 750 and the gate structure of the transistors WPG0 and RPG0 of the memory cell 710 may be aligned along the Y direction. The gate structure of the transistors WPG0 and RPG0 of the memory cell 710 and the gate structures of the transistors WPG0 and RPG0 of the memory cell 750, are coupled to the WWL[0], RWL[0], RWL[1], and WWL[1], respectively, as indicated in FIG. 8. These word lines WWL[0], RWL[0], RWL[1], and WWL[1] may be formed as conductive (e.g., metal) structures or lines disposed across one or more metallization (or back-end-of-line) layers. In some embodiments, the WWL[0], RWL[0], RWL[1], and WWL[1] may extend along the Y direction, as shown in FIG. 8. However, it should be understood that the WWL[0], RWL[0], RWL[1], and WWL[1] of FIG. 8 are provided for illustrating their relative arrangement. The sequence of the WWL[0], RWL [0], RWL[1], and WWL[1] may be adjusted according to various design constraints. Further, each of the WWL[0], RWL[0], RWL[1], and WWL[1] may be in electrical connection with the corresponding gate structure through one or more conductive lines and one or more vias disposed therebetween. Such interposed conductive lines/vias are not illustrated in FIG. 8 for clarity purposes.

In various embodiments, the MDs (filled with a pattern of diagonal stripes) of the transistors WPG0, WPG1, and RPG0 of the memory cell 810 and the transistors WPG0, WPG1, and RPG0 of the memory cell 850 are coupled to the WBL[0], WBLB[0] WBL[1], WBLB[1], and RBL, respectively, as indicated in FIG. 8. It should be noted that, different from the layout 500 (FIG. 5), the memory cells 810 and 850 share the common MD to connect to the RBL. These bit lines WBL[0], WBLB[0], WBL[1], WBLB[1], RBL may be formed as conductive (e.g., metal) structures or lines disposed across one or more metallization (or back-end-of-line) layers. In some embodiments, the WBL[0], WBLB[0], WBL[1], WBLB[1], and RBL may extend along the X direction, as shown in FIG. 8. Similarly, it should be understood that the WBL[0], WBLB[0], WBL[1], WBLB [1], and RBL of FIG. 8 are provided for illustrating their relative arrangement. The sequence of the WBL[0], WBLB [0], WBL[1], WBLB[1], and RBL may be adjusted according to various design constraints. Further, each of the WBL[0], WBLB[0], WBL[1], WBLB[1], and RBL may be in electrical connection with the corresponding S/D terminal through one or more conductive lines and one or more vias disposed therebetween. Such interposed conductive lines/vias are not illustrated in FIG. 8 for clarity purposes.

As a non-limiting example, the RBL may be formed as one or more conductive lines (coupled to each other through the common MD shown in FIG. 8) in a first metallization layer (e.g., M1 layer shown in FIG. 20); the WWL[1] and WWL[0] may be formed as respective conductive lines in a second metallization layer (e.g., M2 layer shown in FIG. 20); the WBL[1], WBLB[1], WBL[0], and WBLB[0] may be formed as respective conductive lines in a third metallization layer (e.g., M3 layer shown in FIG. 20); and the RWL[1] and RWL[0] may be formed as respective conductive lines in a fourth metallization layer (e.g., M4 layer shown in FIG. 20).

Figure 9:
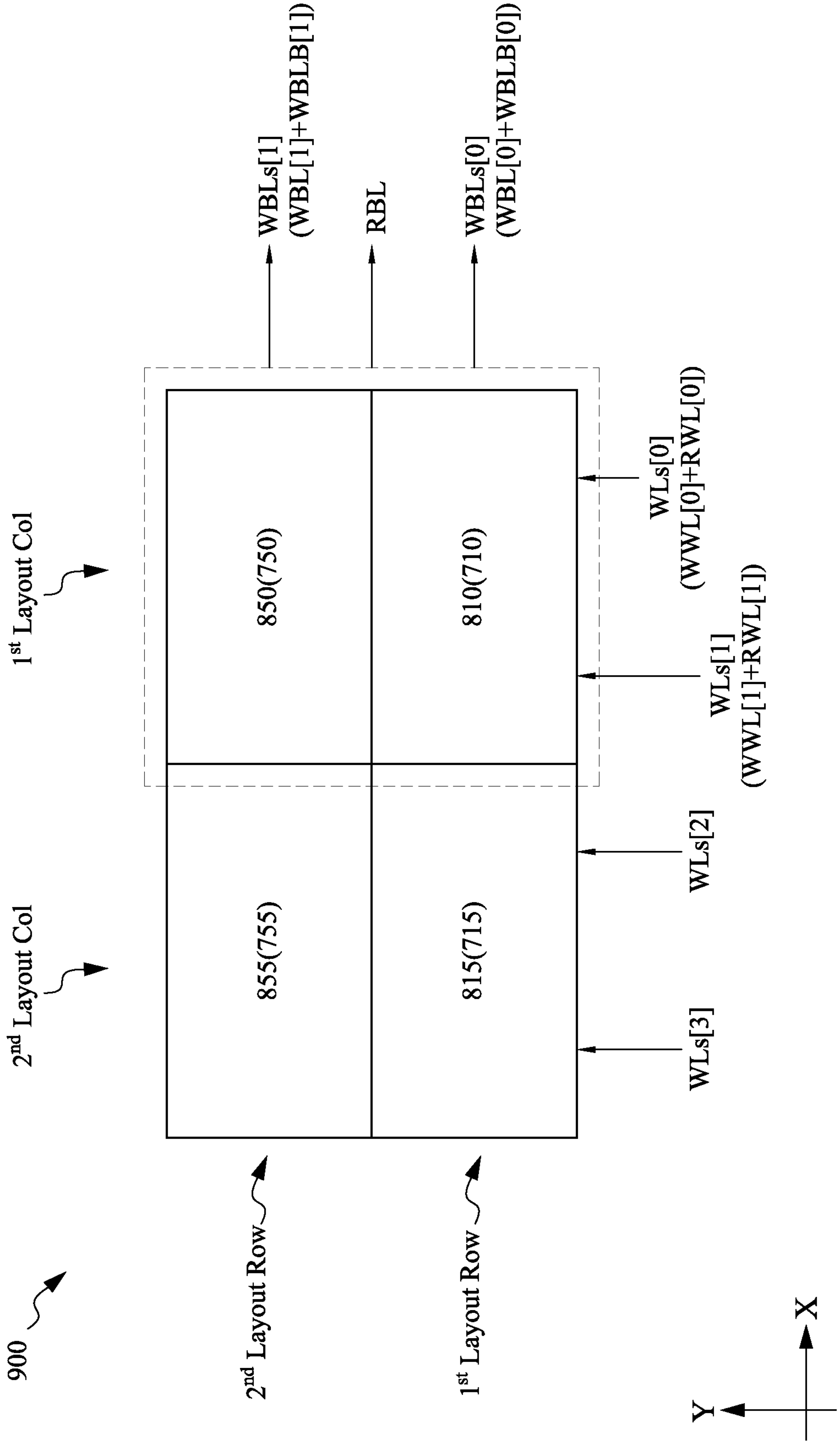
FIG. 9 illustrates a floorplan configured based on the layout of FIG. 8, in accordance with some embodiments.

FIG. 9 illustrates a schematic floorplan 900 corresponding to the layout 800 (FIG. 8), in accordance with some embodiments. The floorplan 900 may represent a physical arrangement, or layout, of multiple memory cells. In addition to the layout portions 810 and 850, the floorplan 900 includes other layout portions 815 and 855 that correspond to other two memory cells, respectively. The layout portions 815 and 855 are disposed next to each other along the Y direction, in which the layout portions 815 and 855 are disposed next to the layout portions 810 and 850 along the X direction, respectively.

Specifically, along a first layout column of the floorplan 800, the layout portions 810 and 850 are disposed next to each other; along a second layout column of the floorplan 900, the layout portions 815 and 855 are disposed next to each other; along a first layout row of the floorplan 900, the layout portions 810 and 815 are disposed next to each other; and along a second layout row of the floorplan 900, the layout portions 850 and 855 are disposed next to each other.

Memory cells, 715 and 755 (indicated in FIG. 9), corresponding to the layout portions 815 and 855 may be disposed in the same circuit column of the memory array 800 (FIG. 8). Thus, four adjacent memory cells along a single circuit column and respective circuit rows of the memory array may be physically arranged across two layout columns and two layout rows, as shown in FIG. 9.

For example, in a circuit/schematic diagram of the memory array (e.g., FIG. 1), the memory cells 710, 750, 715, and 755 may be arranged along a single circuit column and across a first circuit row, a second circuit row, a third circuit row, and a fourth circuit row, respectively. The first circuit row (e.g., row[0]) and third circuit row (e.g., row[2]) may sometimes be referred to as even-numbered rows, and the second circuit row (e.g., row[1]) and four circuit row (e.g., row[3]) may sometimes be referred to as odd-numbered rows, according to some embodiments. In the floorplan 900, the memory cell 710 is disposed at an intersection of the first layout row and the first layout column; the next memory cell 750 (in the circuit diagram) is disposed at an intersection of the second layout row and the first layout column; the next memory cell 715 (in the circuit diagram) is disposed at an intersection of the first layout row and the first layout column; and the next memory cell 755 (in the circuit diagram) is disposed at an intersection of the second layout row and the second layout column. Such a 2×2 checkboard-based floorplan can be used a basis to form a bigger memory array. For example, at least one floorplan similar to the floorplan 900 (representing one even-numbered row of memory cells and one odd-numbered row of memory cells) can be placed above or below the floorplan 900 in the Y direction, thereby forming a 2×4 memory array.

Referring still to FIG. 9, in such an arrangement, each layout column may include a plural number (e.g., 2) of WL sets, each of which includes another plural number (e.g., 2) of WLs, in some embodiments. For example, the first layout column of the floorplan 900 has WL sets, WLs[0] and WLs[1], and the second layout column of the floorplan 900 has WL sets, WLs[2] and WLs[3]. The WL set, WLs[0], can correspond to (e.g., be operatively coupled to) the memory cell 710; the WL set, WLs[1], can correspond to (e.g., be operatively coupled to) the memory cell 750; the WL set, WLs[2], can correspond to (e.g., be operatively coupled to) the memory cell 715; and the WL set, WLs[3], can correspond to (e.g., be operatively coupled to) the memory cell 755. Further, the WLs[0] has WWL[0] and RWL[0] coupled to the memory cell 410, and the WLs[1] has WWL[1] and RWL[1] coupled to the memory cell 450.

With each of the WL set having a plural number (N) of WLs, a length of each BL of the floorplan 900 can be reduced by a factor of N, i.e., the length of each BL of the floorplan 900 is inversely proportional to the number N. For example, the first layout row of the floorplan 900 includes WBL[0] and WBLB[0] that correspond to the memory cell 710; and the second layout row of the floorplan 900 includes WBL[1] and WBLB[1] that correspond to the memory cell 750. The shared RBL may be interposed between the first layout row and the second layout row. According to some embodiments of the present disclosure, by having 2 WLs in each WL set, a length of each of the WBL[0], WBLB[0], WBL[1], WBLB[1], and RBL can be reduced by ½.

Figure 11:
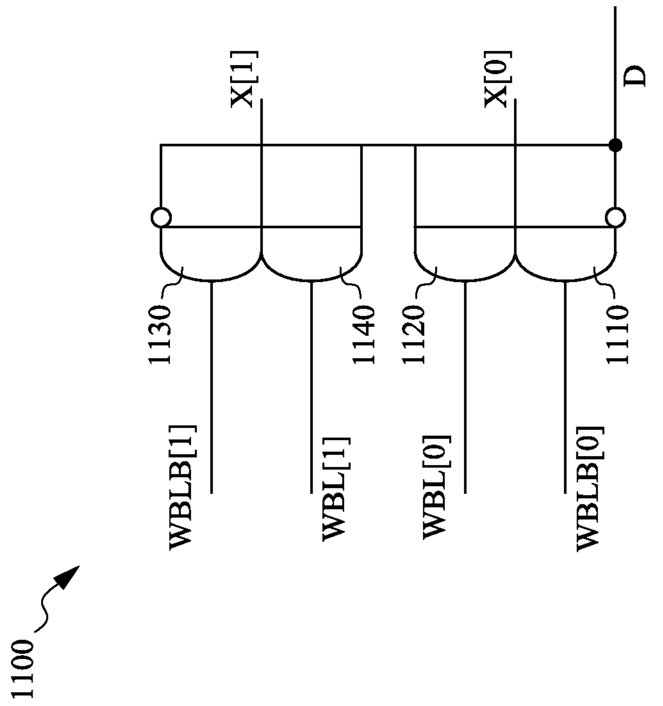
FIGS. 10 and 11 respectively illustrate example circuit diagrams of a decoder circuit, in accordance with some embodiments.
Figure 10:
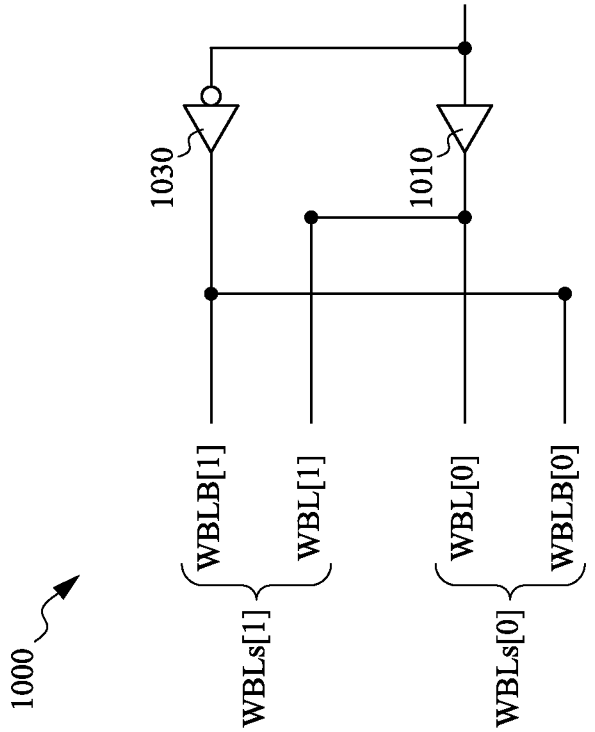

In some embodiments, when the WBLs of different memory cells (e.g., WBLs[0] and WBL[1] in FIGS. 4-6, WBLs[0] and WBL[1] in FIGS. 7-9) are configured as respective or separate conductive structures, the corresponding memory array may include or be operatively coupled to a decoder circuit. The decoder circuit, in general, can selectively write data to one or more of the memory cells. FIGS. 10 and 11 illustrate example circuit diagrams of such a decoder circuit, 1000 and 1100 (hereinafter "decoder 1000" and "decoder 1100"), respectively, in accordance with various embodiments.

Referring first to FIG. 10, the decoder 1000 includes a first buffer 1010 and a second buffer 1030. The first inverter 1010 can receive data "D" and sent the D to the WBL[1] and WBL[0]. The second buffer 1030 can receive the D, logically inverse the D (hereinafter "Dbar"), and send the Dbar to the WBLB[0] and WBLB[1]. As such, the D can be concurrently transmitted to the corresponding memory cells, e.g., 410 and 450 (FIG. 6), 710 and 750 (FIG. 9), through the WBLs[0] and WBL[1]. For example, when the D is at logic high, the D can be transmitted through the WBL[0] and WBL[1] to the corresponding memory cells, with the WBLB [0] and WBLB[1] kept at logic low.

Referring next to FIG. 11, the decoder 1100 includes a first AND gate 1110, a second AND gate 1120, a third AND gate 1130, and a fourth AND gate 1140. The AND gate 1110 can have two inputs, one of which is configured to receive data "D" and logically inverse the D, and the other of which is configured to receive a first portion of address information, X[0]. The AND gate 1110 can perform an AND operation on the inversed D and X[0] and output the result through the WBLB[0] to a corresponding memory cell (e.g., 410 of FIG. 6, 710 of FIG. 9). The AND gate 1120 can have two inputs, one of which is configured to receive the D and the other of which is configured to receive the X[0]. The AND gate 1120 can perform an AND operation on the D and X[0] and output the result through the WBL[0] to a corresponding memory cell (e.g., 410 of FIG. 6, 710 of FIG. 9). The AND gate 1130 can have two inputs, one of which is configured to receive the D and logically inverse the D, and the other of which is configured to receive a second portion of the address information, X[1]. The AND gate 1130 can perform an AND operation on the inversed D and X[1] and output the result through the WBLB[1] to a corresponding memory cell (e.g., 450 of FIG. 6, 750 of FIG. 9). The AND gate 1140 can have two inputs, one of which is configured to receive the D and the other of which is configured to receive the X[1]. The AND gate 1140 can perform an AND operation on the D and X[1] and output the result through the WBL[1] to a corresponding memory cell (e.g., 450 of FIG. 6, 750 of FIG. 9). As such, the D can be can be alternately transmitted to the corresponding memory cells, e.g., 410 or 450 (FIG. 6), 710 or 750 (FIG. 9), through the WBLs[0] or WBL[1]. For example, when the D is at logic high, with the first portion X[0] at logic high and the second portion X[1] at logic low, the D can be transmitted through the WBL[0] to the corresponding memory cell.

Figure 12:
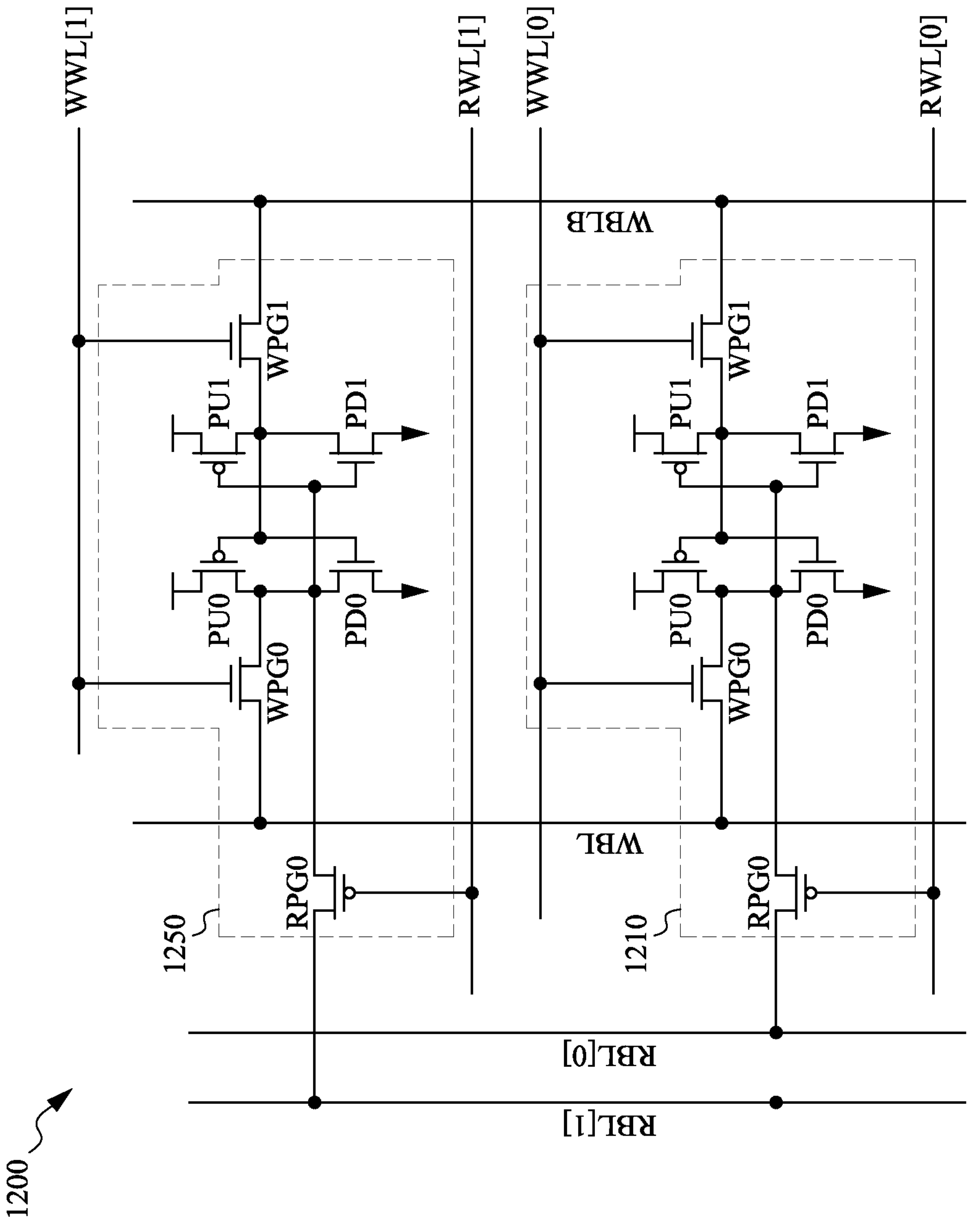
FIG. 12 illustrates an example circuit diagram of a portion of a memory array including the memory cells shown in FIG. 2, in accordance with some embodiments.

FIG. 12 illustrates an example circuit diagram of a portion of yet another memory array 1200 that includes memory cells 1210 and 1250, in accordance with some embodiments. Each of the memory cells 1210 and 1250 is substantially similar to the memory cell 250 (FIG. 2), e.g., consisting of seven transistors (PD0, PD1, WPG0, WPG1, PU0, PU1, and RPG0). Further, in the example of FIG. 12, each of the memory cells 1210 and 1250 is accessed through a corresponding bit line, e.g., RBL, and a corresponding set of two word lines, e.g., WWL and RWL, where the memory cells 1210 and 1250, nevertheless, may share a common set of bit lines, e.g., WBL and WBLB.

In some embodiments, the memory cells 1210 and 1250 may correspond to two adjacent cells disposed in a single circuit column of the memory array. In the example of FIG. 12, the memory cells 1210 and 1250 may correspond to respectively different bit lines and different sets of word lines. For example, the memory cell 1210 can be accessed through WWL[0] and RWL[0], and the shared WBL and WBLB; and the memory cell 1250 can be accessed through WWL[1] and RWL[1], and the shared WBL and WBLB.

Figure 13:
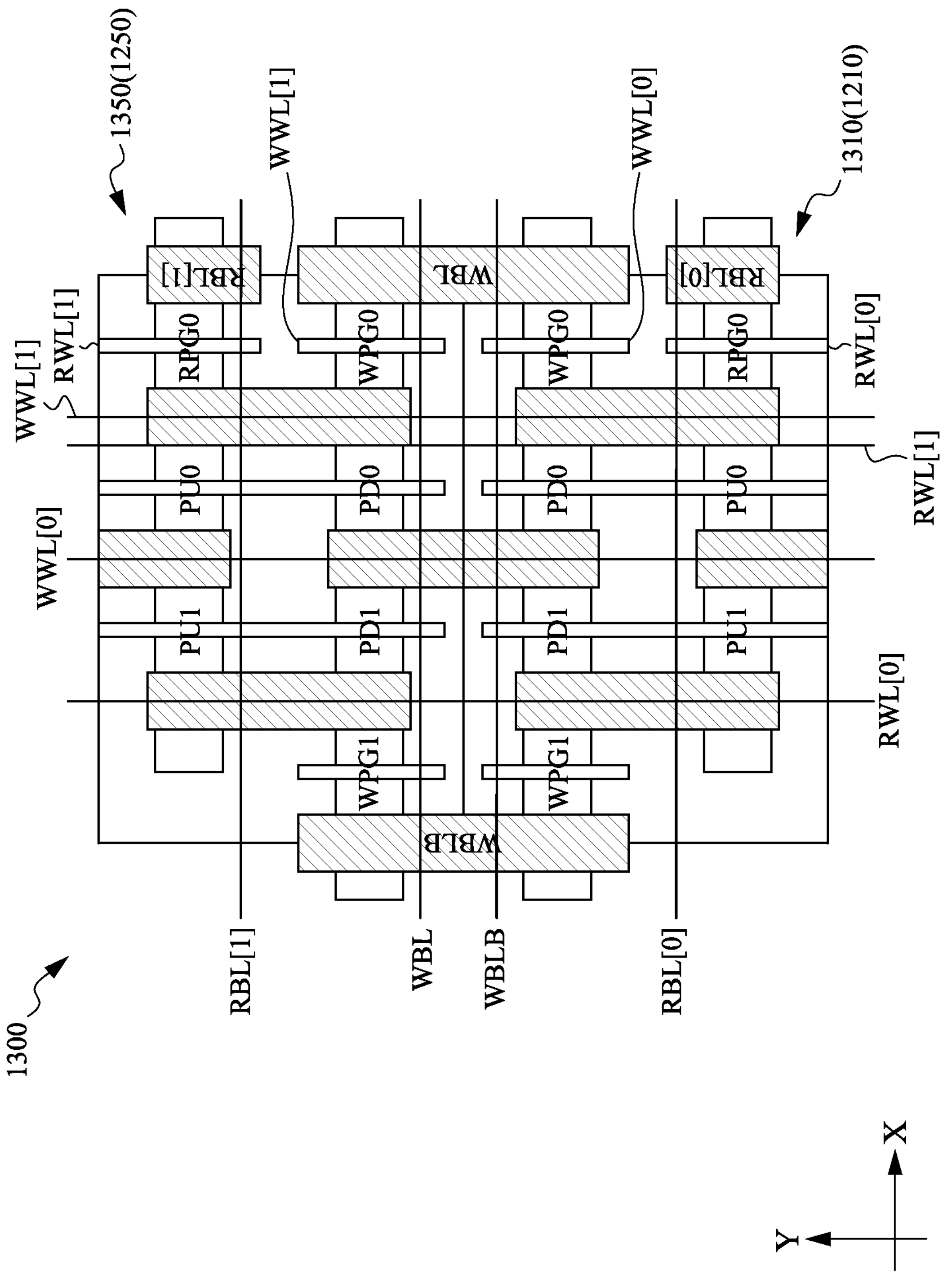
FIG. 13 illustrates an example layout corresponding to the memory array shown in FIG. 12, in accordance with some embodiments.

FIG. 13 illustrates an example layout 1300 corresponding to the memory cells 1210 and 1250 shown in FIG. 12, in accordance with some embodiments. The layout 1300 includes a first portion 1310 and a second portion 1350 corresponding to the memory cells 1210 and 1250, respectively. In some embodiments, the layout portions 1310 and 1350 are arranged next to each other along the Y direction. Each of the layout portions 1310 and 1350 is substantially similar to the layout 300 (FIG. 3). Thus, the following discussion of the layout 1300 will be focused on the difference, e.g., how the respective access lines WWL[0], RWL [0], WWL[1], RWL[1], RBL[0], RBL[1], WBL and WBLB are arranged.

In various embodiments, the gate structures of the transistors WPG0 and RPG0 of the memory cell 1250 and the gate structure of the transistors WPG0 and RPG0 of the memory cell 1210 may be aligned along the Y direction. The gate structure of the transistors WPG0 and RPG0 of the memory cell 1210 and the gate structures of the transistors WPG0 and RPG0 of the memory cell 1250, are coupled to the WWL[0], RWL[0], RWL[1], and WWL[1], respectively, as indicated in FIG. 13. These word lines WWL[0], RWL[0], RWL[1], and WWL[1] may be formed as conductive (e.g., metal) structures or lines disposed across one or more metallization (or back-end-of-line) layers. In some embodiments, the WWL[0], RWL[0], RWL[1], and WWL[1] may extend along the Y direction, as shown in FIG. 13. However, it should be understood that the WWL[0], RWL[0], RWL[1], and WWL[1] of FIG. 13 are provided for illustrating their relative arrangement. The sequence of the WWL[0], RWL [0], RWL[1], and WWL[1] may be adjusted according to various design constraints. Further, each of the WWL[0], RWL[0], RWL[1], and WWL[1] may be in electrical connection with the corresponding gate structure through one or more conductive lines and one or more vias disposed therebetween. Such interposed conductive lines/vias are not illustrated in FIG. 13 for clarity purposes.

In various embodiments, the MDs (filled with a pattern of diagonal stripes) of the transistors WPG0, WPG1, and RPG0 of the memory cell 1310 and the transistors WPG0, WPG1, and RPG0 of the memory cell 1350 are coupled to the WBL, WBLB, RBL[0], and RBL[1], respectively, as indicated in FIG. 13. It should be noted that, different from the layout 500 (FIG. 5), the memory cells 1310 and 1350 share the common MDs to connect to the WBL and WBLB, respectively. These bit lines WBL, WBLB, RBL[0], and RBL[1] may be formed as conductive (e.g., metal) structures or lines disposed across one or more metallization (or back-end-of-line) layers. In some embodiments, the WBL, WBLB, RBL[0], and RBL[1] may extend along the X direction, as shown in FIG. 13. Similarly, it should be understood that the WBL, WBLB, RBL[0], and RBL[1] of FIG. 13 are provided for illustrating their relative arrangement. The sequence of the WBL, WBLB, RBL[0], and RBL[1] may be adjusted according to various design constraints. Further, each of the WBL, WBLB, RBL[0], and RBL[1] may be in electrical connection with the corresponding S/D terminal through one or more conductive lines and one or more vias disposed therebetween. Such interposed conductive lines/vias are not illustrated in FIG. 13 for clarity purposes.

As a non-limiting example, the RBL[1] and RBL[0] may be formed as respective conductive lines in a first metallization layer (e.g., M1 layer shown in FIG. 20); the WWL[1] and WWL[0] may be formed as respective conductive lines in a second metallization layer (e.g., M2 layer shown in FIG. 20); the WBL and WBLB may be formed as respective conductive lines in a third metallization layer (e.g., M3 layer shown in FIG. 20); and the RWL[1] and RWL[0] may be formed as respective conductive lines in a fourth metallization layer (e.g., M4 layer shown in FIG. 20).

Figure 14:
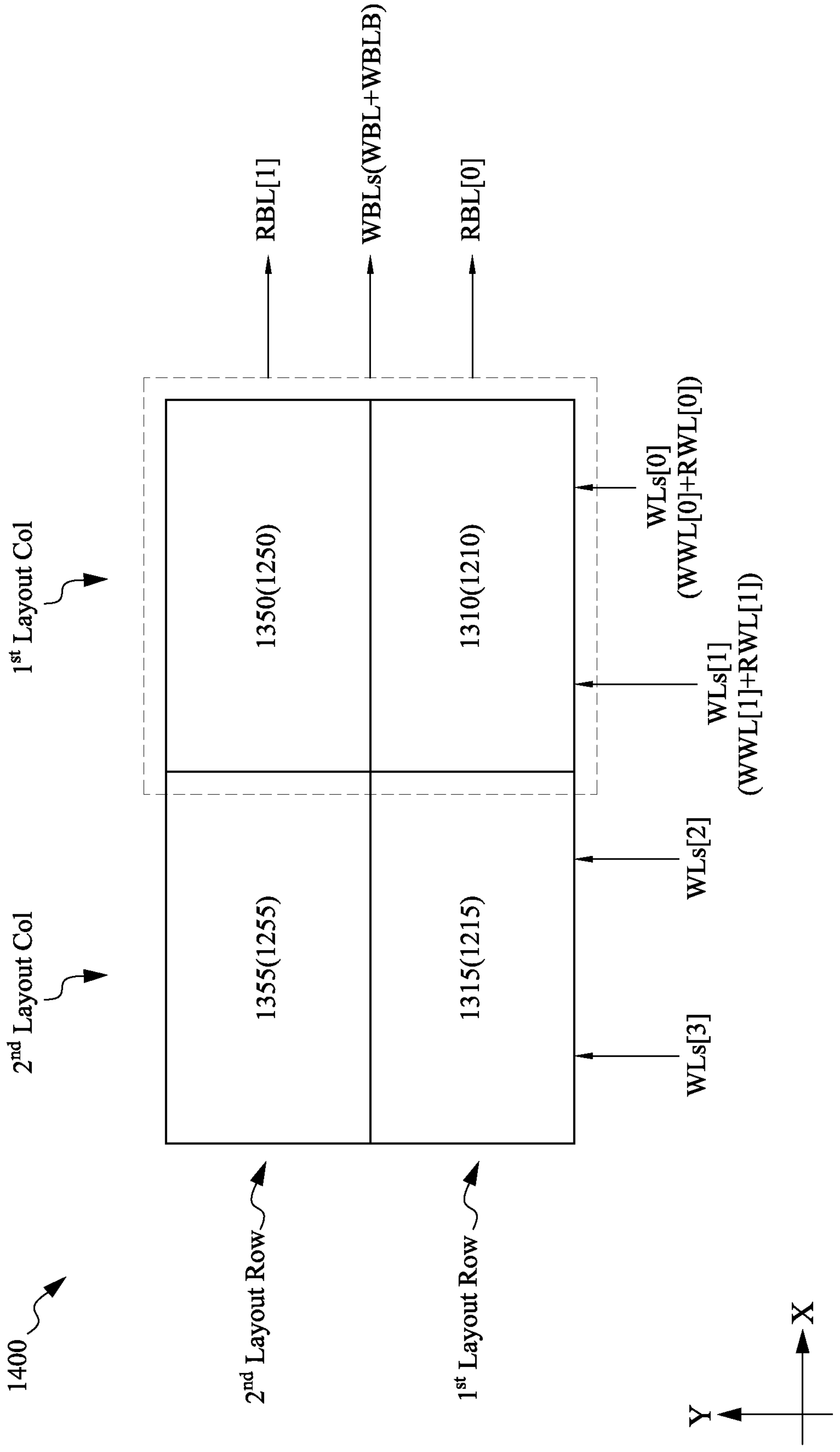
FIG. 14 illustrates a floorplan configured based on the layout of FIG. 13, in accordance with some embodiments.

FIG. 14 illustrates a schematic floorplan 1400 corresponding to the layout 1300 (FIG. 13), in accordance with some embodiments. The floorplan 1400 may represent a physical arrangement, or layout, of multiple memory cells. In addition to the layout portions 1310 and 1350, the floorplan 1400 includes other layout portions 1315 and 1355 that correspond to other two memory cells, respectively. The layout portions 1315 and 1355 are disposed next to each other along the Y direction, in which the layout portions 1315 and 1355 are disposed next to the layout portions 1310 and 1350 along the X direction, respectively.

Specifically, along a first layout column of the floorplan 1400, the layout portions 1310 and 1350 are disposed next to each other; along a second layout column of the floorplan 1400, the layout portions 1315 and 1355 are disposed next to each other; along a first layout row of the floorplan 1400, the layout portions 1310 and 1315 are disposed next to each other; and along a second layout row of the floorplan 1400, the layout portions 1350 and 1355 are disposed next to each other. Memory cells, 1215 and 1255 (indicated in FIG. 14), corresponding to the layout portions 1315 and 1355 may be disposed in the same circuit column of the memory array 1200 (FIG. 12). Thus, four adjacent memory cells along a single circuit column and respective circuit rows of the memory array may be physically arranged across two layout columns and two layout rows, as shown in FIG. 14.

For example, in a circuit/schematic diagram of the memory array (e.g., FIG. 1), the memory cells 1210, 1250, 1215, and 1255 may be arranged along a single circuit column and across a first circuit row, a second circuit row, a third circuit row, and a fourth circuit row, respectively. The first circuit row (e.g., row[0]) and third circuit row (e.g., row[2]) may sometimes be referred to as even-numbered rows, and the second circuit row (e.g., row[1]) and four circuit row (e.g., row[3]) may sometimes be referred to as odd-numbered rows, according to some embodiments. In the floorplan 1400, the memory cell 1210 is disposed at an intersection of the first layout row and the first layout column; the next memory cell 1250 (in the circuit diagram) is disposed at an intersection of the second layout row and the first layout column; the next memory cell 1215 (in the circuit diagram) is disposed at an intersection of the first layout row and the first layout column; and the next memory cell 1255 (in the circuit diagram) is disposed at an intersection of the second layout row and the second layout column. Such a 2×2 checkboard-based floorplan can be used a basis to form a bigger memory array. For example, at least one floorplan similar to the floorplan 1400 (representing one even-numbered row of memory cells and one odd-numbered row of memory cells) can be placed above or below the floorplan 1400 in the Y direction, thereby forming a 2×4 memory array.

Referring still to FIG. 14, in such an arrangement, each layout column may include a plural number (e.g., 2) of WL sets, each of which includes another plural number (e.g., 2) of WLs, in some embodiments. For example, the first layout column of the floorplan 1400 has WL sets, WLs[0] and WLs[1], and the second layout column of the floorplan 1400 has WL sets, WLs[2] and WLs[3]. The WL set, WLs[0], can correspond to (e.g., be operatively coupled to) the memory cell 1210; the WL set, WLs[1], can correspond to (e.g., be operatively coupled to) the memory cell 1250; the WL set, WLs[2], can correspond to (e.g., be operatively coupled to) the memory cell 1215; and the WL set, WLs[3], can correspond to (e.g., be operatively coupled to) the memory cell 1255. Further, the WLs[0] has WWL[0] and RWL[0] coupled to the memory cell 1210, and the WLs[1] has WWL[1] and RWL[1] coupled to the memory cell 1250.

With each of the WL set having a plural number (N) of WLs, a length of each BL of the floorplan 1400 can be reduced by a factor of N, i.e., the length of each BL of the floorplan 1400 is inversely proportional to the number N. For example, the first layout row of the floorplan 1400 includes RBL[0] that corresponds to the memory cell 1210; and the second layout row of the floorplan 1400 includes RBL[1] that corresponds to the memory cell 1250. The shared WBL and WBLB may be interposed between the first layout row and the second layout row. According to some embodiments of the present disclosure, by having 2 WLs in each WL set, a length of each of the WBL, WBLB, RBL[0], and RBL[1] can be reduced by ½.

Figure 15:
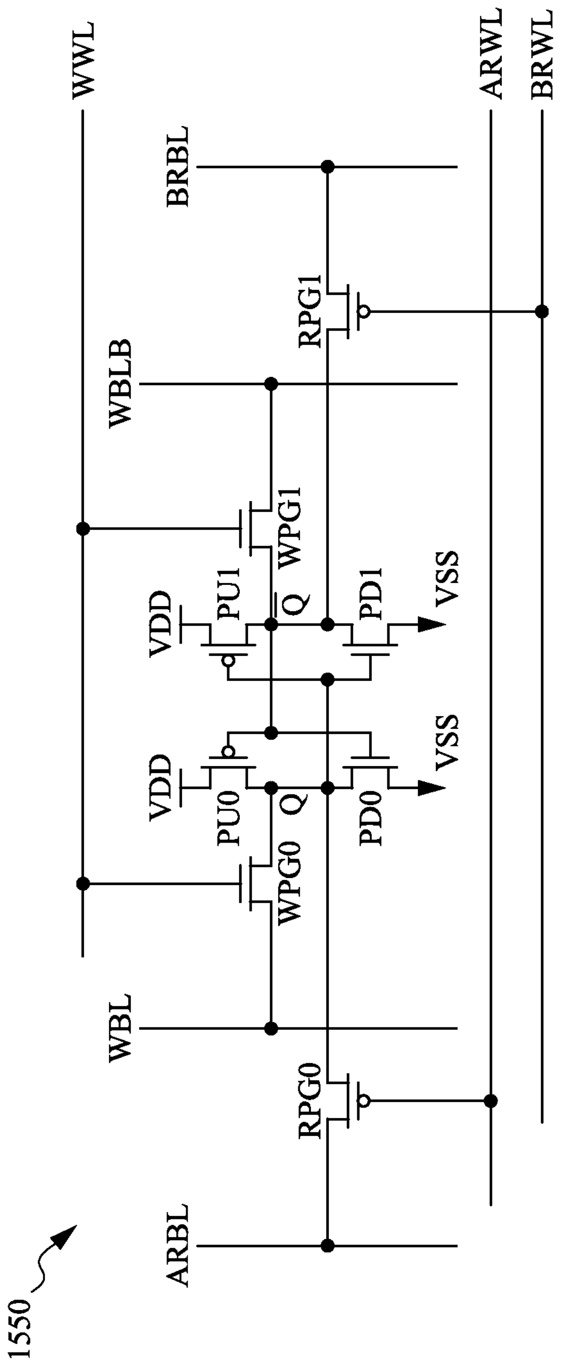
FIG. 15 illustrates another example circuit diagram of the memory cell of FIG. 1, in accordance with some embodiments.

FIG. 15 illustrates another example circuit diagram of the memory cell 150 shown in FIG. 1 (hereinafter "memory cell 1550"), in accordance with some embodiments. As shown, the memory cell 1550 consists of eight transistors: pull-up 0 transistor (PU0), pull-up 1 transistor (PU1), pull-down 0 transistor (PD0), pull-down 1 transistor (PD1), write pass gate 0 transistor (WPG0), write pass gate 1 transistor (WPG1), read pass gate 0 transistor (RPG0), read pass gate 1 transistor (RPG1), in which the transistors PU0, PU1, RPG0, and RPG1 are each implemented as a p-type metal-oxide-semiconductor field-effect-transistor (MOSFET), and the transistors PD0, PD1, WPG0, and WPG1 are each implemented as an n-type MOSFET. However, it should be understood that these transistors can each be configured otherwise, while remaining within the scope of the present disclosure.

In general, the transistors PU0 and PD0 form a first invertor, and the transistors PU1 and PD1 form a second inverter. Such two inverters are cross-coupled to each other. Power is supplied to each of the inverters, for example, a first terminal of each of the transistors PU0 and PU1 is coupled to a power supply VDD, while a first terminal of each of transistors PD0 and PD1 is coupled to a reference voltage VSS, for example, ground. A bit of data is stored in the memory cell 1550 as a voltage level at the node Q. The data stored at the node Q can be read by circuitry (e.g., a sense amplifier) via a first read bit line ARBL, which is enabled through the transistor RPG0 gate by a first read word line ARWL; and the data stored at the node Qbar can be read by circuitry (e.g., a sense amplifier) via a second read bit line BRBL, which is enabled through the transistor RPG1 gate by a second read word line BRWL. Access (e.g., write operation) to the node Q is controlled by the transistor WPG0. The node Qbar stores the complement to value at Q, e.g., if Q is "high," Qbar is "low," and access to Qbar is controlled by the transistor WPG1. A gate of the transistor WPG0 is coupled to (e.g., controlled by) a write word line WWL. A first source/drain (S/D) terminal of the transistor WPG0 is coupled to a write bit line WBL, and a second S/D terminal of the transistor WPG0 is coupled to the second terminals of the transistors PU0 and PD0 at the node Q. Similarly, a gate of the transistor WPG1 is also coupled to the write word line WWL. A first S/D terminal of the transistor WPG1 is coupled to (e.g., controlled by) a complementary write bit line WBLB, and a second S/D terminal of the transistor WPG1 is coupled to second terminals of the transistors PU1 and PD1 at the node Qbar.

Figure 16:
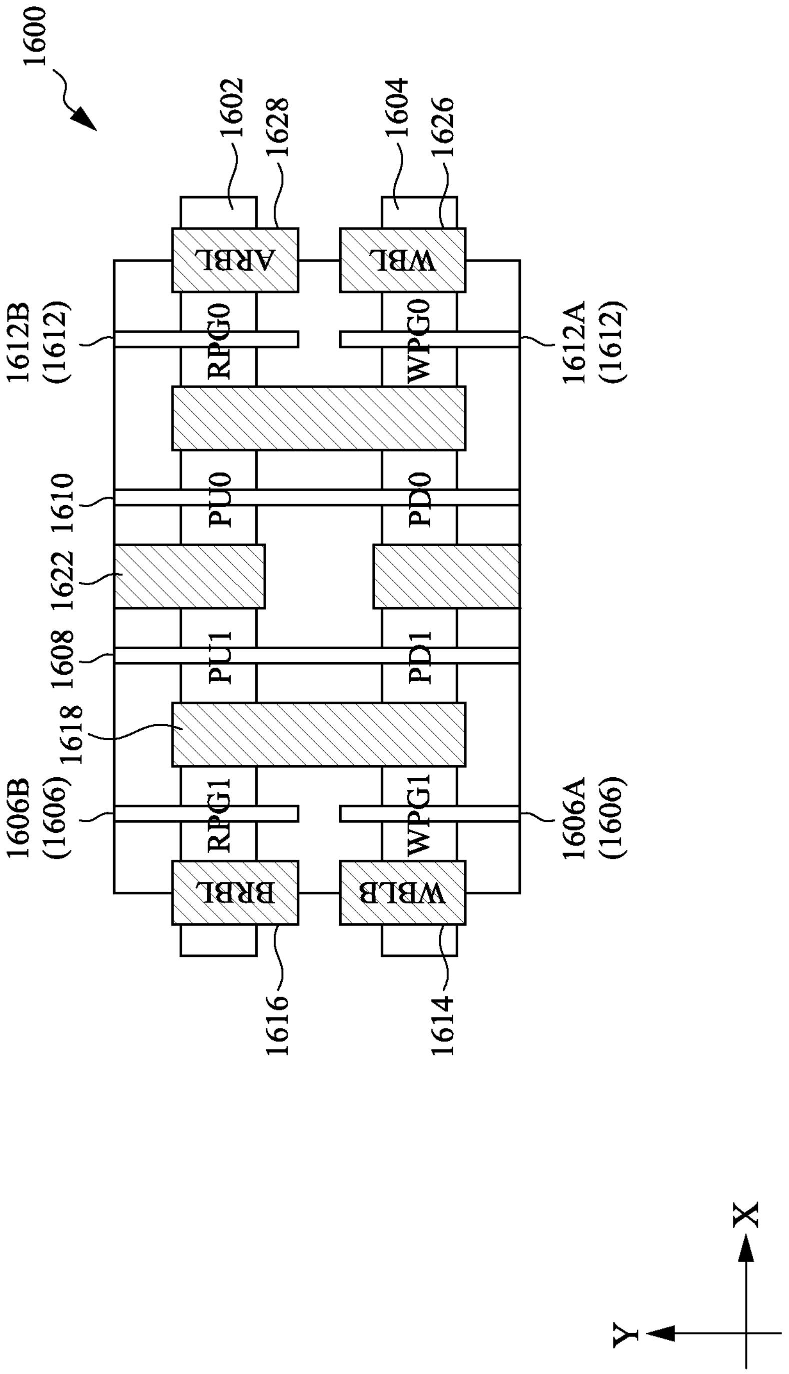
FIG. 16 illustrates an example layout corresponding to the memory cell shown in FIG. 15, in accordance with some embodiments.

FIG. 16 illustrates an example layout 1600 corresponding to the memory cell 1550 shown in FIG. 15, in accordance with some embodiments. The layout 1600 may be used to fabricate the memory cell 1550 as a number (e.g., 8) of nanostructure transistors (e.g., GAA transistors, etc.), in some embodiments. However, it is understood that the layout is not limited to fabricating nanostructure transistors. The layout 1600 may be used to fabricate the memory cell 1550 as any of various other types of transistors such as, for example, nanowire transistors, nanosheet transistors, FinFETs, etc., while remaining within the scope of the present disclosure. The components of the layout 1600 are the same or are substantially similar to those depicted in FIG. 15, and thus, some of the reference numerals may be reused in the discussion of FIG. 16.

As shown, the layout 1600 includes patterns 1602 and 1604 extending along a first lateral direction (e.g., the X direction), and patterns 1606, 1608, 1610, and 1612 extending along a second lateral direction (e.g., the Y direction). The patterns 1602 and 1604 are each configured to form an active region (e.g., a fin structure, a well, a protruding structure having alternately stacked silicon and silicon germanium layers, etc., which is sometimes referred to as an oxide diffusion (OD) region) over a substrate, and the patterns 1606 to 1612 are each configured to form a gate (e.g., a polysilicon gate, a metal gate, etc.) over the active regions. Accordingly, the patterns 1602 and 1604 may each be referred to as an active region, and the patterns 1606 to 1612 may each be referred to as a gate structure.

In some embodiments, the active region 1604 may have n-type conductivity, and the active region 1602 may have p-type conductivity. Based on the 4CPP architecture, each of the active regions 1602 and 1604 is traversed or otherwise overlaid by the four gate structures 1606 to 1612. Accordingly, the eight transistors, PD0, PD1, WPG0, WPG1, PU0, PU1, RPG0, and RPG1, of the memory cell 1550 (FIG. 15) can each be formed by a corresponding one of the active regions and a corresponding one of the gate structures, as shown in FIG. 16. For example, the transistor WPG1 can be formed by the active region 1604 and a first segment of the gate structure 1606A; the transistor RPG1 can be formed by the active region 1602 and a second segment of the gate structure 1606B; the transistor PD1 can be formed by the active region 1604 and the gate structure 1608; the transistor PU1 can be formed by the active region 1602 and the gate structure 1608; the transistor PD0 can be formed by the active region 1604 and the gate structure 1610; the transistor PU0 can be formed by the active region 1602 and the gate structure 1610; the transistor WPG0 can be formed by the active region 1604 and a first segment of the gate structure 1612A; and the transistor RPG0 can be formed by the active region 1602 and a second segment of the gate structure 1612B.

The layout 1600 further includes patterns configured to form a number of interconnect structures to operatively (e.g., electrically) couple the transistors PD0, PD1, WPG0, WPG1, PU0, PU1, RPG0, and RPG1 to one another, forming the circuit shown in FIG. 15. For example, the layout 1600 includes patterns 1614, 1616, 1618, 1620, 1622, 1624, 1626, and 1628, each of which is configured to form a source/drain interconnect structure (e.g., sometimes referred to as a metal definition (MD) structure). The patterns 1614 to 1628 are hereinafter referred to as "MD 1614," "MD 1616," "MD 1618," "MD 1620," "MD 1622," "MD 1624," "MD 1626," and "MD 1628," respectively. These MDs 1614 to 1628 can extend along the lengthwise direction of the gate structures, in some embodiments. As such, the MDs 1614 to 1628 can electrically couple the different transistors of a memory cell to each other, couple one or more of the transistors to a corresponding access line (e.g., the WBLB, the ARBL, the BRBL, the WBL), or couple one or more of the transistors to an interconnect structure carrying a supply voltage (e.g., VDD, ground). For example, the MD 1614 can couple one of the S/D terminals of the transistor WPG1 to the WBLB; the MD 1616 can couple one of the S/D terminals of the transistor RPG1 to the BRBL; the MD 1626 can couple one of the S/D terminals of the transistor WPG0 to the WBL; and the MD 1628 can couple one of the S/D terminals of the transistor RPG0 to the ARBL.

Figure 17:
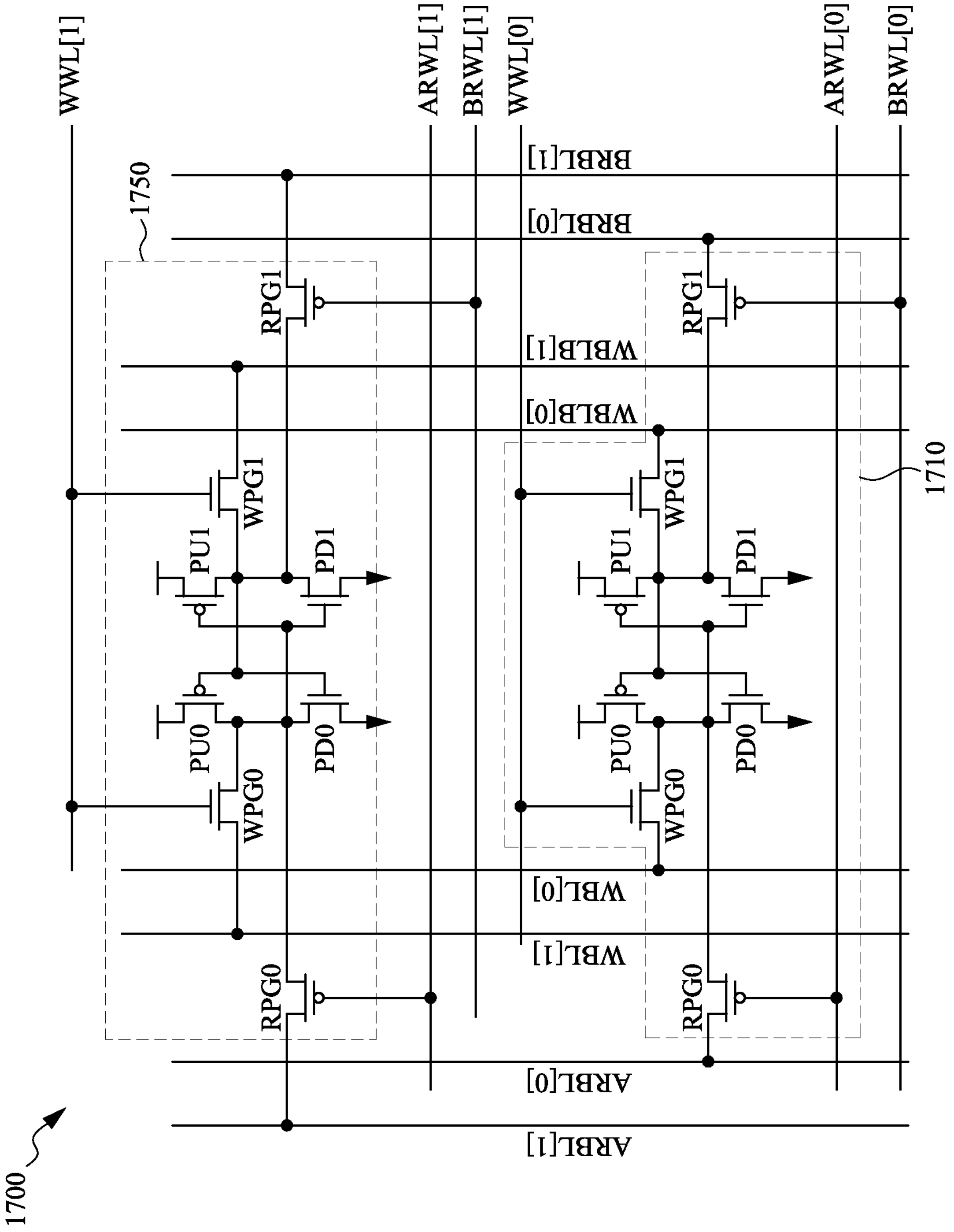
FIG. 17 illustrates an example circuit diagram of a portion of a memory array including the memory cells shown in FIG. 15, in accordance with some embodiments.

FIG. 17 illustrates an example circuit diagram of a portion of a memory array 1700 that includes memory cells 1710 and 1750, in accordance with some embodiments. Each of the memory cells 1710 and 1750 is substantially similar to the memory cell 1550 (FIG. 15), e.g., consisting of eight transistors (PD0, PD1, WPG0, WPG1, PU0, PU1, RPG0, and RPG1). Further, in the example of FIG. 17, each of the memory cells 1710 and 1750 is accessed through a corresponding set of four bit lines, e.g., ARBL, BRBL, WBL, and WBLB, and a corresponding set of three word lines, e.g., WWL, ARWL, and BRWL.

In some embodiments, the memory cells 1710 and 1750 may correspond to two adjacent cells disposed in a single circuit column of the memory array 1700. Further, in the example of FIG. 17, the memory cells 1710 and 1750 may correspond to respectively different sets of bit lines and different sets of word lines. For example, the memory cell 1710 can be accessed through WWL[0], ARWL[0], BRWL [0], WBL[0], WBLB[0], ARBL[0], and BRBL[0]; and the memory cell 1750 can be accessed through WWL[1], ARWL[1], BRWL[1], WBL[1], WBLB[1], ARBL[1], and BRBL[1].

Figure 18:
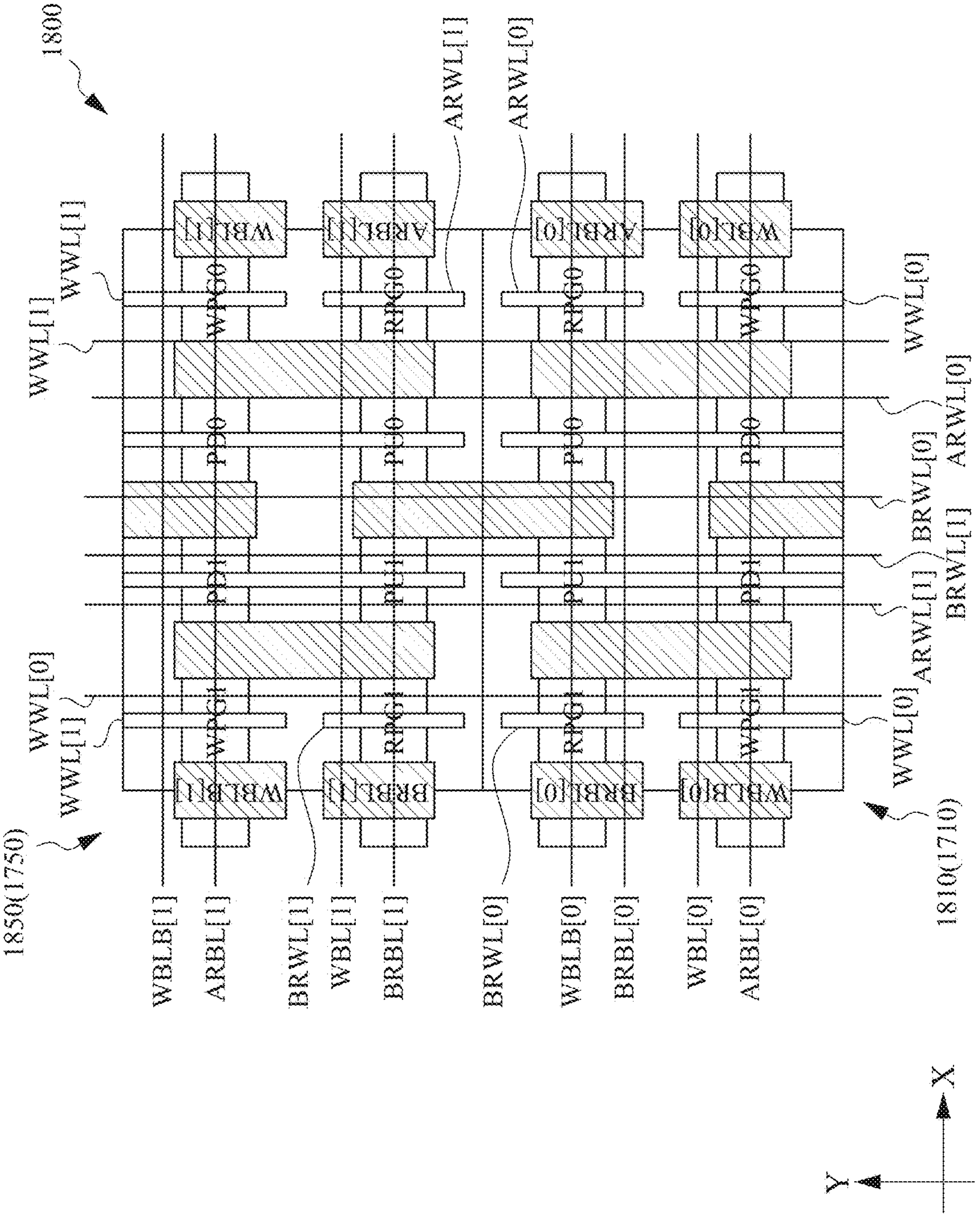
FIG. 18 illustrates an example layout corresponding to the memory array shown in FIG. 17, in accordance with some embodiments.

FIG. 18 illustrates an example layout 1800 corresponding to the memory cells 1710 and 1750 shown in FIG. 17, in accordance with some embodiments. The layout 1800 includes a first portion 1810 and a second portion 1850 corresponding to the memory cells 1710 and 1750, respectively. In some embodiments, the layout portions 1810 and 1850 are arranged next to each other along the Y direction. Each of the layout portions 1810 and 1850 is substantially similar to the layout 1600 (FIG. 16). Thus, the following discussion of the layout 1800 will be focused on the difference, e.g., how the respective access lines WWL[0], ARWL [0], BRWL[0], WBL[0], WBLB[0], ARBL[0], BRBL[0], WWL[1], ARWL[1], BRWL[1], WBL[1], WBLB[1], ARBL [1], and BRBL[1] are arranged.

In various embodiments, the gate structures of the transistors WPG0 and RPG0 of the memory cell 1750 and the gate structure of the transistors WPG0 and RPG0 of the memory cell 1710 may be aligned along the Y direction; and the gate structures of the transistors WPG1 and RPG1 of the memory cell 1750 and the gate structure of the transistors WPG1 and RPG1 of the memory cell 1710 may be aligned along the Y direction. As indicated in FIG. 18, the gate structure of the transistors WPG0 and RPG0 of the memory cell 1710 and the gate structures of the transistors WPG0 and RPG0 of the memory cell 1750, are coupled to the WWL[0], ARWL[0], WWL[1], and ARWL[1], respectively; and the gate structure of the transistors WPG1 and RPG1 of the memory cell 1710 and the gate structures of the transistors WPG1 and RPG1 of the memory cell 1750, are coupled to the WWL[0], BRWL[0], WWL[1], and BRWL[1], respectively. These word lines WWL[0], ARWL[0], BRWL[0], WWL[1], ARWL[1], BRWL[1] may be formed as conductive (e.g., metal) structures or lines disposed across one or more metallization (or back-end-of-line) layers. In some embodiments, the WWL[0], ARWL[0], BRWL[0], WWL [1], ARWL[1], BRWL[1] may extend along the Y direction, as shown in FIG. 18. However, it should be understood that the WWL[0], ARWL[0], BRWL[0], WWL[1], ARWL[1], BRWL[1] of FIG. 18 are provided for illustrating their relative arrangement. The sequence of the WWL[0], ARWL [0], BRWL[0], WWL[1], ARWL[1], BRWL[1] may be adjusted according to various design constraints. Further, each of the WWL[0], ARWL[0], BRWL[0], WWL[1], ARWL[1], BRWL[1] may be in electrical connection with the corresponding gate structure through one or more conductive lines and one or more vias disposed therebetween. Such interposed conductive lines/vias are not illustrated in FIG. 18 for clarity purposes.

In various embodiments, the MDs (filled with a pattern of diagonal stripes) of the transistors WPG0, WPG1, RPG0, and RPG1 of the memory cell 1710 and the transistors WPG0, WPG1, RPG0, and RPG1 of the memory cell 1750 are coupled to the WBL[0], WBLB[0], ARBL[0], BRBL[0], WBL[1], WBLB[1], ARBL[1], and BRBL[1], respectively, as indicated in FIG. 18. These bit lines WBL[0], WBLB[0], ARBL[0], BRBL[0], WBL[1], WBLB[1], ARBL[1], and BRBL[1] may be formed as conductive (e.g., metal) structures or lines disposed across one or more metallization (or back-end-of-line) layers. In some embodiments, the WBL [0], WBLB[0], ARBL[0], BRBL[0], WBL[1], WBLB[1], ARBL[1], and BRBL[1] may extend along the X direction, as shown in FIG. 18. Similarly, it should be understood that the ARBL[0], BRBL[0], WBL[1], WBLB[1], ARBL[1], and BRBL[1] of FIG. 18 are provided for illustrating their relative arrangement. The sequence of the ARBL[0], BRBL [0], WBL[1], WBLB[1], ARBL[1], and BRBL[1] may be adjusted according to various design constraints. Further, each of the ARBL[0], BRBL[0], WBL[1], WBLB[1], ARBL [1], and BRBL[1] may be in electrical connection with the corresponding S/D terminal through one or more conductive lines and one or more vias disposed therebetween. Such interposed conductive lines/vias are not illustrated in FIG. 18 for clarity purposes.

As a non-limiting example, the ARBL[1], ARBL[0], BRBL[1], and BRBL[0] may be formed as respective conductive lines in a first metallization layer (e.g., M1 layer shown in FIG. 20); the WWL[1] and WWL[0] may be formed as respective conductive lines in a second metallization layer (e.g., M2 layer shown in FIG. 20); the WBL[0], WBLB[0], WBL[1], WBLB[1] may be formed as respective conductive lines in a third metallization layer (e.g., M3 layer shown in FIG. 20); and the ARWL[1], ARWL[0], BRWL[1], BRWL[0] may be formed as respective conductive lines in a fourth metallization layer (e.g., M4 layer shown in FIG. 20).

Figure 19:
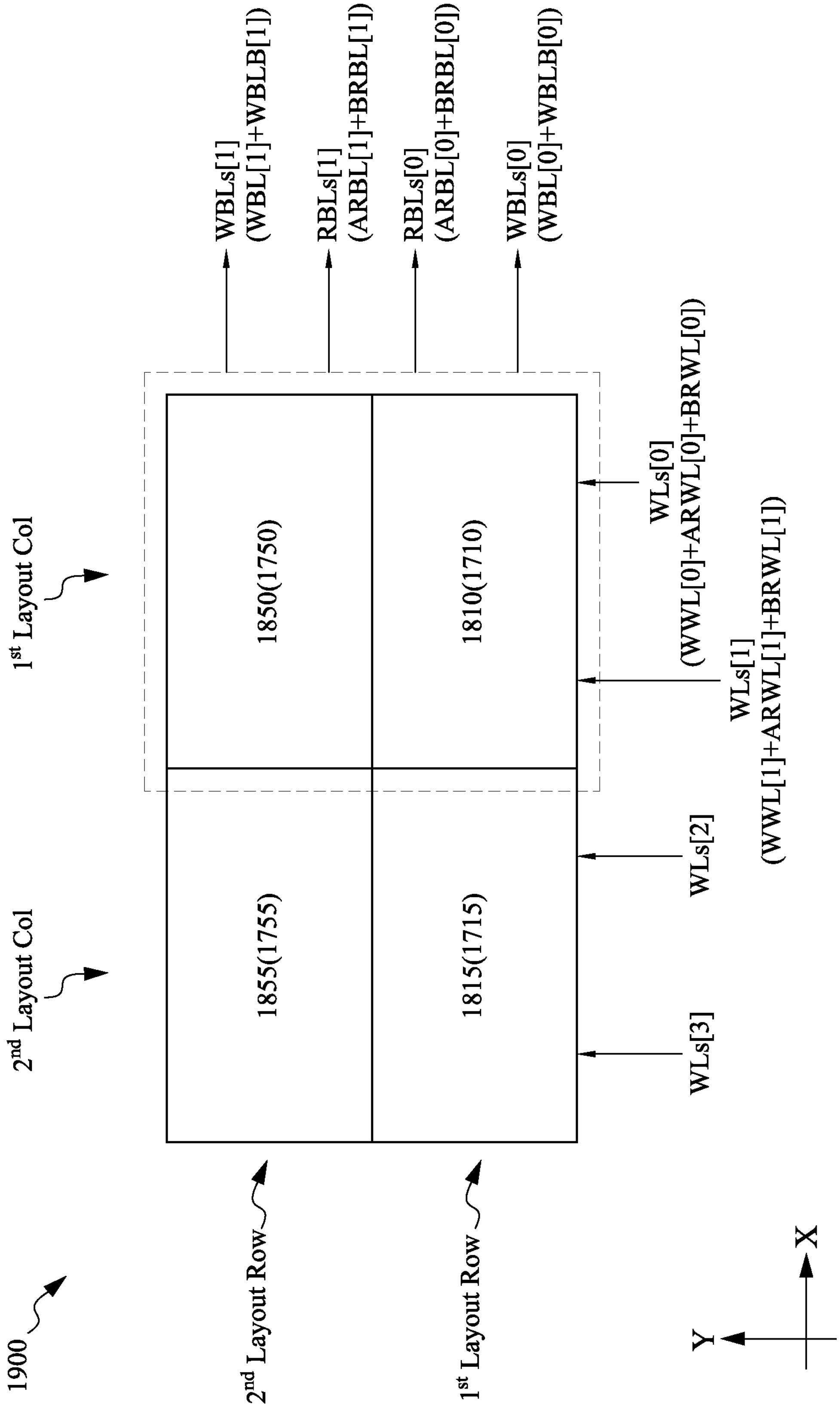
FIG. 19 illustrates a floorplan configured based on the layout of FIG. 18, in accordance with some embodiments.

FIG. 19 illustrates a schematic floorplan 1900 corresponding to the layout 1800 (FIG. 18), in accordance with some embodiments. The floorplan 1900 may represent a physical arrangement, or layout, of multiple memory cells. In addition to the layout portions 1810 and 1850, the floorplan 1900 includes other layout portions 1815 and 1855 that correspond to other two memory cells, respectively. The layout portions 1815 and 1855 are disposed next to each other along the Y direction, in which the layout portions 1815 and 1855 are disposed next to the layout portions 1810 and 1850 along the X direction, respectively.

Specifically, along a first layout column of the floorplan 1900, the layout portions 1810 and 1850 are disposed next to each other; along a second layout column of the floorplan 1900, the layout portions 1815 and 1855 are disposed next to each other; along a first layout row of the floorplan 1900, the layout portions 1810 and 1815 are disposed next to each other; and along a second layout row of the floorplan 1900, the layout portions 1850 and 1855 are disposed next to each other. Memory cells, 1715 and 1755 (indicated in FIG. 19), corresponding to the layout portions 1815 and 1855 may be disposed in the same circuit column of the memory array 1700 (FIG. 17). Thus, four adjacent memory cells along a single circuit column and respective circuit rows of the memory array may be physically arranged across two layout columns and two layout rows, as shown in FIG. 19.

For example, in a circuit/schematic diagram of the memory array (e.g., FIG. 1), the memory cells 1710, 1750, 1715, and 1755 may be arranged along a single circuit column and across a first circuit row, a second circuit row, a third circuit row, and a fourth circuit row, respectively. The first circuit row (e.g., row[0]) and third circuit row (e.g., row[2]) may sometimes be referred to as even-numbered rows, and the second circuit row (e.g., row[1]) and four circuit row (e.g., row[3]) may sometimes be referred to as odd-numbered rows, according to some embodiments. In the floorplan 1900, the memory cell 1710 is disposed at an intersection of the first layout row and the first layout column; the next memory cell 1750 (in the circuit diagram) is disposed at an intersection of the second layout row and the first layout column; the next memory cell 1715 (in the circuit diagram) is disposed at an intersection of the first layout row and the second layout column; and the next memory cell 1755 (in the circuit diagram) is disposed at an intersection of the second layout row and the second layout column. Such a 2×2 checkboard-based floorplan can be used a basis to form a bigger memory array. For example, at least one floorplan similar to the floorplan 1900 (representing one even-numbered row of memory cells and one odd-numbered row of memory cells) can be placed above or below the floorplan 1900 in the Y direction, thereby forming a 2×4 memory array.

Referring still to FIG. 19, in such an arrangement, each layout column may include a plural number (e.g., 2) of WL sets, each of which includes another plural number (e.g., 3) of WLs, in some embodiments. For example, the first layout column of the floorplan 1900 has WL sets, WLs[0] and WLs[1], and the second layout column of the floorplan 1900 has WL sets, WLs[2] and WLs[3]. The WL set, WLs[0], can correspond to (e.g., be operatively coupled to) the memory cell 1710; the WL set, WLs[1], can correspond to (e.g., be operatively coupled to) the memory cell 1750; the WL set, WLs[2], can correspond to (e.g., be operatively coupled to) the memory cell 1715; and the WL set, WLs[3], can correspond to (e.g., be operatively coupled to) the memory cell 1755. Further, the WLs[0] has WWL[0], ARWL[0], and BRWL[0] coupled to the memory cell 1710, and the WLs[1] has WWL[1], ARWL[1], and BRWL[1] coupled to the memory cell 1750.

With each of the WL set having a plural number (N) of WLs, a length of each BL of the floorplan 1900 can be reduced by a factor of N, i.e., the length of each BL of the floorplan 1900 is inversely proportional to the number N. For example, the first layout row of the floorplan 1900 includes WBL[0], WBLB[0], ARBL[0], and BRBL[0] that correspond to the memory cell 1710; and the second layout row of the floorplan 1900 includes WBL[1], WBLB[1], ARBL[1], and BRBL[1] that correspond to the memory cell 1750. According to some embodiments of the present disclosure, by having 3 WLs in each WL set, a length of each of the WBL[0], WBLB[0], ARBL[0], BRBL[0], WBL[1], WBLB[1], ARBL[1], and BRBL[1] can be reduced by ⅓.

FIG. 20 depicts a cross-sectional view of a portion of a semiconductor device including a gate (structure), a source (terminal/structure), a drain (terminal/structure), an MD, a VD, a VG, one or more conductive lines in M1 layer (sometimes referred to as M0 tracks), one or more vias V1s, one or more conductive lines in M2 layer (sometimes referred to as M2 tracks), one or more vias V2s, one or more conductive lines in M3 layer (sometimes referred to as M3 tracks), one or more vias V3s, and one or more conductive lines in M4 layer (sometimes referred to as M4 tracks). It should be understood that the cross-sectional view of FIG. 20 is provided as a general example to illustrate how such conductive lines and vias are vertically arranged with a transistor. Thus, the transistor shown in FIG. 20 can be any of the above-discussed transistors.

As shown, a transistor 2000 is formed over a substrate. The transistor 2000 includes a gate, a pair of source and drain disposed on the opposite sides of the gate. The transistor 2000 may be formed as a GAA transistor in which an active region is formed as a number of semiconductor layers vertically spaced from one another, with a portion of the active region overlaid by the gate functioning as its gate and with portions on the sides of the gate respectively functioning as its source and drain. Further, a portion of the active region is embedded by an isolation region/structure. Over the transistor 2000, the VG is connected to the gate, allowing the gate to be coupled to one or more conductive lines disposed thereupon. The MD is connected to one of the source or drain and the VD is connected to the MD, allowing the source or drain to be coupled to one of the M1 tracks, which is further coupled through one of the V1s to one of the M2 tracks, which is further coupled through one of the V2s to one of the M3 tracks, which is further coupled through one of the V3s to one of the M4 tracks.

Figure 21:
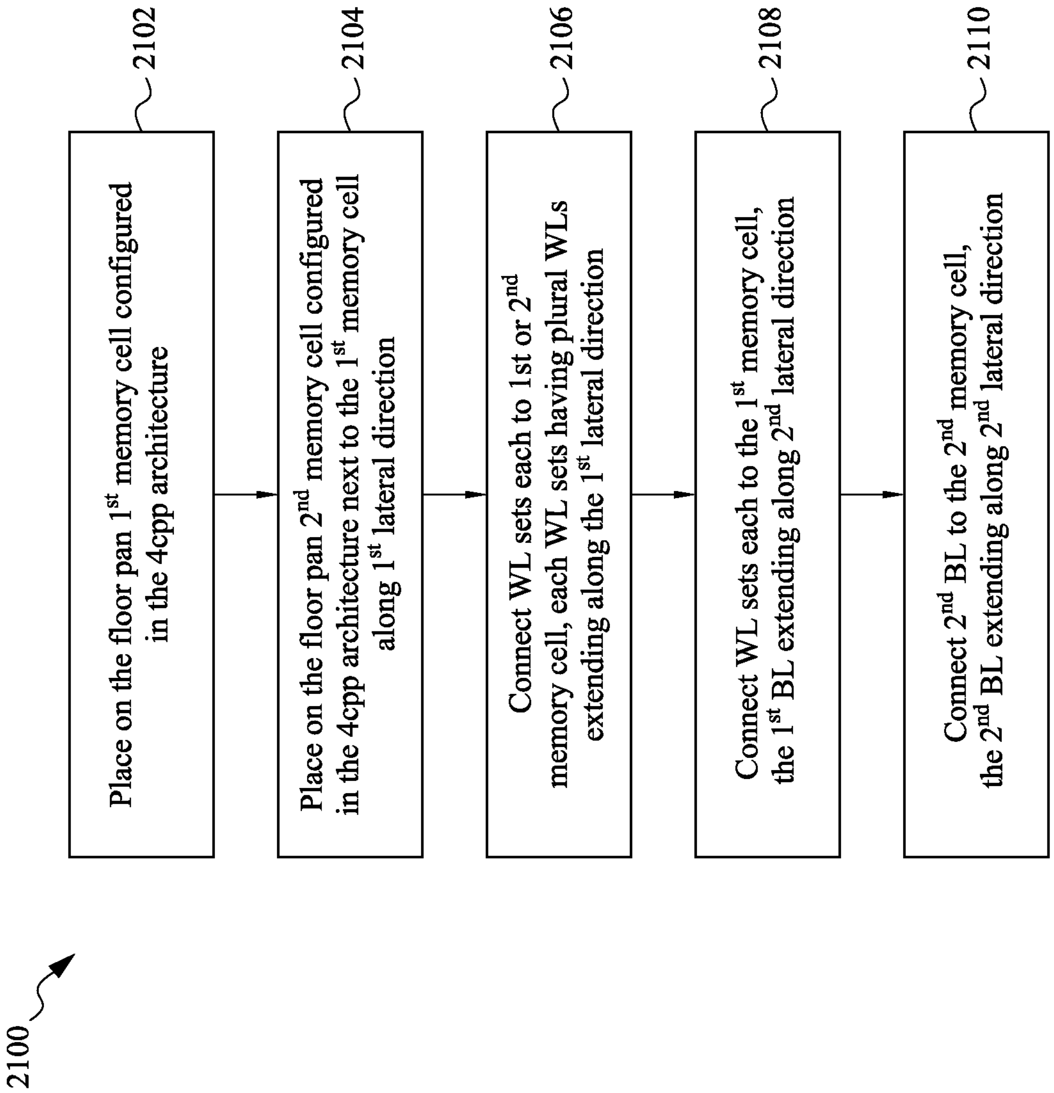
FIG. 21 illustrates an example flow chart of a method for optimizing layout designs in integrated circuits, in accordance with some embodiments.

FIG. 21 illustrates a flow chart of an example method 2100 for forming a memory array, in accordance with various embodiments. In some embodiments, operations of the method 2100 are performed in the order depicted in FIG. 21. In some other embodiments, operations of the method 2100 may be performed simultaneously and/or in an order other than the order depicted in FIG. 21.

The method 2100 starts with operation 2102 of placing, on a floorplan, a first memory cell formed in a four-contact polysilicon pitch (4CPP) architecture. In some embodiments, the floorplan may correspond to a portion of a layout dedicated for physically forming a memory array on a substrate. The memory array includes a plural number of memory cells (including the first memory cell). In a corresponding (or equivalent) circuit diagram, the memory array has a number of circuit rows and a number of circuit columns intersecting with one another, where each of the memory cells is located at an intersection of a corresponding pair of the circuit rows and circuit columns. In various embodiments, each of the memory cells has a number of transistors operatively coupled to one another, e.g., 7T SRAM 250 (FIG. 2), 8T SRAM 1550 (FIG. 15), etc., and the transistors of each memory cell are formed based on the 4CPP architecture described above.

The substrate may be a semiconductor substrate, such as a bulk semiconductor, or the like, which may be doped (e.g., with a p-type or an n-type dopant) or undoped. The substrate 802 may be a wafer, such as a silicon wafer. Other substrates, such as a multi-layered or gradient substrate may also be used. In some embodiments, the semiconductor material of the substrate 802 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

For example in FIGS. 4-6, the first memory cell may be the memory cell 410, which is a 7T SRAM, placed in the floorplan 600. For another example in FIGS. 7-9, the first memory cell may be the memory cell 710, which is a 7T SRAM, placed in the floorplan 900. For yet another example in FIGS. 12-14, the first memory cell, which is a 7T SRAM, may be the memory cell 1210 placed in the floorplan 1400. For yet another example in FIGS. 17-19, the first memory cell may be the memory cell 1710, which is an 8T SRAM, placed in the floorplan 1900. Each of the floorplans 600, 900, 1400, and 1900 may define a footprint for a layout of the corresponding memory array. Specifically, each of these floorplans defines the footprint for a layout of each of the memory cells included in the memory array. Such a layout can be used to fabricate the memory array (and its memory cells) on the substrate. As will be discussed below, each of these floorplans has a number of layout columns and a number of layout rows intersecting with one another.

The method 2100 proceeds to operation 2104 of placing, on the floorplan, a second memory cell next to the first memory cell along a first lateral direction and also formed in the 4CPP architecture. In various embodiments of the present disclosure, the second memory cell may be operatively configured and physically formed in similar fashion to the first memory cell. For example, the second memory cell may also be configured as a 7T SRAM or an 8T SRAM, and may also be formed based on the 4CPP architecture. Further, in some embodiments, the second memory cell may be formed in the same circuit column as the first memory cell. Still further, the second memory cell may be physically placed along the first lateral direction that extends in one of the layout columns of the floorplan, according to various embodiments.

For example in FIGS. 4-6, the second memory cell may be the memory cell 450, which is a 7T SRAM, placed in the floorplan 600. For another example in FIGS. 7-9, the second memory cell may be the memory cell 750, which is a 7T SRAM, placed in the floorplan 900. For yet another example in FIGS. 12-14, the second memory cell, which is a 7T SRAM, may be the memory cell 1250 placed in the floorplan 1400. For yet another example in FIGS. 17-19, the second memory cell may be the memory cell 1750, which is an 8T SRAM, placed in the floorplan 1900. The memory cells 450, 750, 1250, and 1750, which are operatively configured as the next cell of the memory cells 410, 710, 1210, and 1710 in the same circuit column, respectively, may be physically placed next to the memory cells 410, 710, 1210, and 1710 in the same layout column.

The method 2100 proceeds to operation 2106 of connecting a number of sets of word lines (sometimes referred to as "WL sets") each to a corresponding one of the first and second memory cells. In various embodiments of the present disclosure, a plural number (M) of WL sets is arranged along the same layout column, e.g., where the first and second memory cells are disposed, and the WL sets are each operatively (e.g., electrically) connected to a respective one of the first and second memory cells. Further, the WL sets each have a plural number (N) of WLs that extend along the first lateral direction (i.e., the relative arrangement direction between the first memory cell and the second memory cell).

For example in FIGS. 4-6, two (M) WL sets, WLs[0] and WLs[1], are formed along the first layout column of the floorplan 600 to connect to the first memory cell 410 and second memory cell 450, respectively. Further, the WL set, WLs[0], has two (N) WLs, WWL[0] and RWL[0], and the WL set, WLs[1], has two (N) WLs, WWL[1] and RWL[1]. For another example in FIGS. 7-9, two (M) WL sets, WLs[0] and WLs[1], are formed along the first layout column of the floorplan 900 to connect to the first memory cell 710 and second memory cell 750, respectively. Further, the WL set, WLs[0], has two (N) WLs, WWL[0] and RWL[0], and the WL set, WLs[1], has two (N) WLs, WWL[1] and RWL[1]. For yet another example in FIGS. 12-14, two (M) WL sets, WLs[0] and WLs[1], are formed along the first layout column of the floorplan 1400 to connect to the first memory cell 1310 and second memory cell 1350, respectively. Further, the WL set, WLs[0], has two (N) WLs, WWL[0] and RWL[0], and the WL set, WLs[1], has two (N) WLs, WWL[1] and RWL[1]. For yet another example in FIGS. 17-19, two (M) WL sets, WLs[0] and WLs[1], are formed along the first layout column of the floorplan 1900 to connect to the first memory cell 1710 and second memory cell 1750, respectively. Further, the WL set, WLs[0], has three (N) WLs, WWL[0], ARWL[0], and BRWL[0], and the WL set, WLs[1], has three (N) WLs, WWL[1], ARWL[1], and BRWL[1].

The method 2100 proceeds to operation 2108 of connecting a first bit line (BL) to the first memory cell. In various embodiments of the present disclosure, the first BL extends along a second lateral direction perpendicular to the first lateral direction, i.e., perpendicular to the relative arrangement direction between the first memory cell and the second memory cell. Based on different layout/circuit configurations, the first BL may include a single BL or multiple BLs.

For example in FIGS. 4-6, the first BL may include WBL[0] and WBLB[0], and may further include RBL[0]. Each of the WBL[0], WBLB[0], and RBL[0] is operatively (e.g., electrically) connected to the first memory cell 410, and extends along the second lateral direction (perpendicular to the lengthwise direction of the corresponding WLs). For another example in FIGS. 7-9, the first BL may include WBL[0] and WBLB[0]. Each of the WBL[0] and WBLB[0] is operatively (e.g., electrically) connected to the first memory cell 710, and extends along the second lateral direction (perpendicular to the lengthwise direction of the corresponding WLs). For yet another example in FIGS. 12-14, the first BL may include RBL[0]. The RBL[0] is operatively (e.g., electrically) connected to the first memory cell 1210, and extends along the second lateral direction (perpendicular to the lengthwise direction of the corresponding WLs). For yet another example in FIGS. 17-19, the first BL may include WBL[0] and WBLB[0], and may further include ARBL[0] and BRBL[0]. Each of the WBL[0], WBLB[0], ARBL[0], and BRBL[0] is operatively (e.g., electrically) connected to the first memory cell 1710, and extends along the second lateral direction (perpendicular to the lengthwise direction of the corresponding WLs).

The method 2100 proceeds to operation 2110 of connecting a second BL to the second memory cell. In various embodiments of the present disclosure, the second BL extends along the second lateral direction. Similarly, the second BL may include a single BL or multiple BLs. By physically placing the second memory cell next to the first memory cell in the direction perpendicular to a lengthwise direction of the BLs, a length of the first and second BLs can be reduced. Further, by having the plural number (N) of WLs in each WL set, the length of the first and second BLs can be adjusted to be inversely proportional to the number N.

For example in FIGS. 4-6, the second BL may include WBL[1] and WBLB[1], and may further include RBL[1]. Each of the WBL[1], WBLB[1], and RBL[1] is operatively (e.g., electrically) connected to the second memory cell 450, and extends along the second lateral direction (perpendicular to the lengthwise direction of the corresponding WLs). For another example in FIGS. 7-9, the second BL may include WBL[1] and WBLB[1]. Each of the WBL[1] and WBLB[1] is operatively (e.g., electrically) connected to the second memory cell 750, and extends along the second lateral direction (perpendicular to the lengthwise direction of the corresponding WLs). For yet another example in FIGS. 12-14, the second BL may include RBL[1]. The RBL[1] is operatively (e.g., electrically) connected to the second memory cell 1250, and extends along the second lateral direction (perpendicular to the lengthwise direction of the corresponding WLs). For yet another example in FIGS. 17-19, the second BL may include WBL[1] and WBLB[1], and may further include ARBL[1] and BRBL[1]. Each of the WBL[1], WBLB[1], ARBL[1], and BRBL[1] is operatively (e.g., electrically) connected to the second memory cell 1750, and extends along the second lateral direction (perpendicular to the lengthwise direction of the corresponding WLs).

In some embodiments, the first memory cell and the second memory cell may share one or more bit lines. For example in FIGS. 7-9, the firsts memory cell 710 and the second memory cell 750 may share RBL. The RBL is operatively (e.g., electrically) connected to both the first memory cell 710 and the second memory cell 750, and extends along the second lateral direction (perpendicular to the lengthwise direction of the corresponding WLs). For another example in FIGS. 12-14, the firsts memory cell 1210 and the second memory cell 1250 may share WBL and WBLB. The WBL and WBLB are each operatively (e.g., electrically) connected to both the first memory cell 1210 and the second memory cell 1250, and extend along the second lateral direction (perpendicular to the lengthwise direction of the corresponding WLs).

Figure 22:
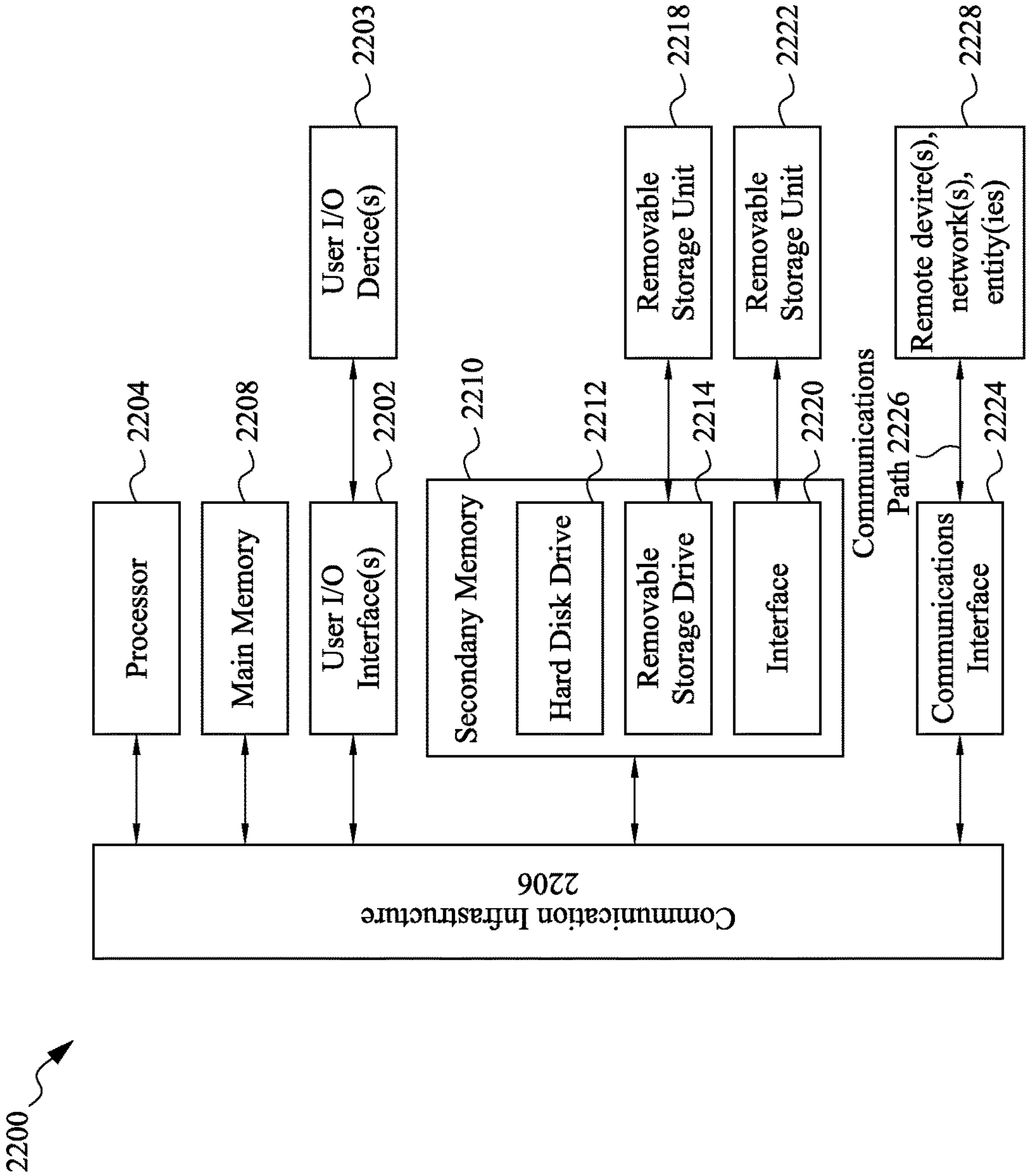
FIG. 22 illustrates an example computer system for implementing various embodiments of the present disclosure, in accordance with some embodiments.

FIG. 22 illustrates an example computer system 2200 in which various embodiments of the present disclosure can be implemented, in accordance with various embodiments. Computer system 2200 can be any well-known computer capable of performing the functions and operations described herein. For example, and without limitation, computer system 2200 can be configured to place a plural number of memory cells according to the disclosed method 2100 (FIG. 21). Computer system 2200, such as an EDA tool, can execute one or more of the operations in the method 2100. As such, a memory array including the memory cells (formed in the 4CPP architecture) can be formed with a reduced length of bit lines.

Computer system 2200 includes one or more processors (also called central processing units, or CPUs), such as a processor 2204. Processor 2204 is connected to a communication infrastructure or bus 2206. Computer system 2200 also includes input/output device(s) 2203, such as monitors, keyboards, pointing devices, etc., that communicate with communication infrastructure or bus 2206 through input/output interface(s) 2202. An EDA tool can receive instructions to implement functions and operations described herein e.g., the method 2100 of FIG. 21—via input/output device(s) 2203. Computer system 2200 also includes a main or primary memory 2208, such as random access memory (RAM). Main memory 2208 can include one or more levels of cache. Main memory 2208 has stored therein control logic (e.g., computer software) and/or data. In some embodiments, the control logic (e.g., computer software) and/or data can include one or more of the operations described above with respect to the method 2100 of FIG. 21.

Computer system 2200 can also include one or more secondary storage devices or memory 2210. Secondary memory 2210 can include, for example, a hard disk drive 2212 and/or a removable storage device or drive 2214. Removable storage drive 2214 can be a floppy disk drive, a magnetic tape drive, a compact disk drive, an optical storage device, tape backup device, and/or any other storage device/drive.

Removable storage drive 2214 can interact with a removable storage unit 2218. Removable storage unit 2218 includes a computer usable or readable storage device having stored thereon computer software (control logic) and/or data. Removable storage unit 2218 can be a floppy disk, magnetic tape, compact disk, DVD, optical storage disk, and/any other computer data storage device. Removable storage drive 2214 reads from and/or writes to removable storage unit 2218.

According to some embodiments, secondary memory 2210 can include other means, instrumentalities or other approaches for allowing computer programs and/or other instructions and/or data to be accessed by computer system 2200. Such means, instrumentalities or other approaches can include, for example, a removable storage unit 2222 and an interface 2220. Examples of the removable storage unit 2222 and the interface 2220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 2210, removable storage unit 2218, and/or removable storage unit 2222 can include one or more of the operations described above with respect to the method 2100 of FIG. 21.

Computer system 2200 can further include a communication or network interface 2224. Communication interface 2224 enables computer system 2200 to communicate and interact with any combination of remote devices, remote networks, remote entities, etc. (individually and collectively referenced by reference number 2228). For example, communication interface 2224 can allow computer system 2200 to communicate with remote devices 2228 over communications path 2226, which can be wired and/or wireless, and which can include any combination of LANs, WANs, the Internet, etc. Control logic and/or data can be transmitted to and from computer system 2200 via communication path 2226.

The operations in the preceding embodiments can be implemented in a wide variety of configurations and architectures. Therefore, some or all of the operations in the preceding embodiments e.g., the method 2100 of FIG. 21 and method 2300 of FIG. 23 (described below) can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 2200, main memory 2208, secondary memory 2210 and removable storage units 2218 and 2222, as well as tangible articles of manufacture embodying any combination of the foregoing. Such control logic, when executed by one or more data processing devices (such as computer system 2200), causes such data processing devices to operate as described herein. In some embodiments, computer system 2200 is installed with software to perform operations in the manufacturing of photomasks and circuits, as illustrated in method 2300 of FIG. 23 (described below). In some embodiments, computer system 2200 includes hardware/equipment for the manufacturing of photomasks and circuit fabrication. For example, the hardware/equipment can be connected to or be part of element 2228 (remote device(s), network(s), entity(ies)) of computer system 2200.

Figure 23:
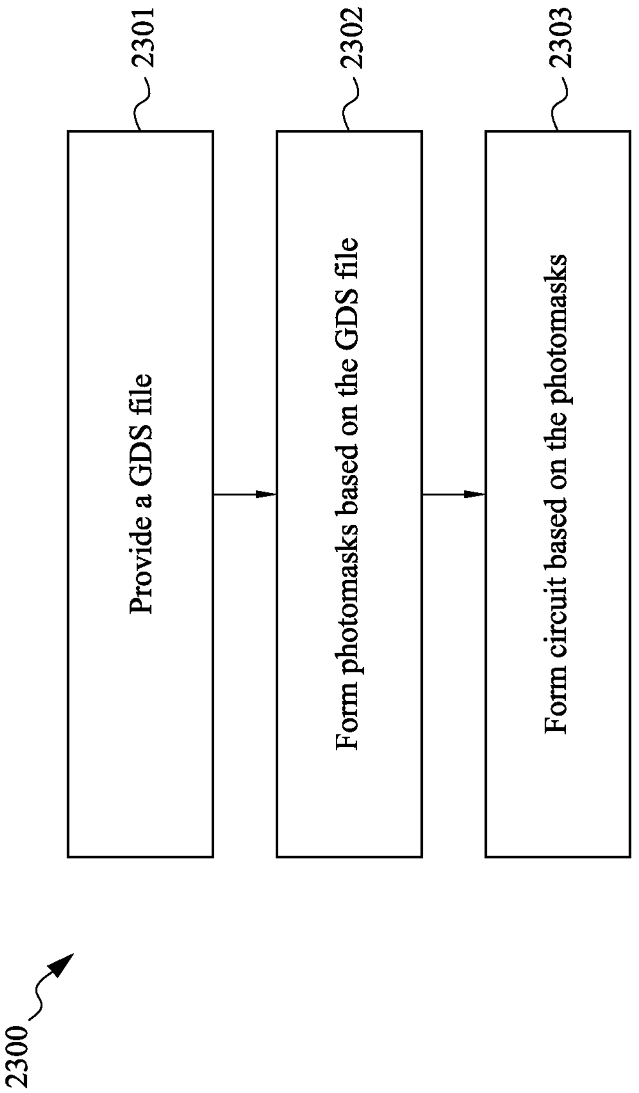
FIG. 23 illustrates a process to form a semiconductor device based on a graphic database system (GDS) file, in accordance with some embodiments.

FIG. 23 illustrates an example method 2300 for fabricating an circuit or device (e.g., a memory array), according to some embodiments. Operations of method 2300 can also be performed in a different order and/or vary. Variations of method 2300 should also be within the scope of the present disclosure.

In operation 2301, a Graphic Database System (GDS) file is provided. The GDS file can be generated by an EDA tool and contain the floorplan that has already been optimized using the disclosed method. The operation depicted in 2301 can be performed by, for example, an EDA tool that operates on a computer system, such as computer system 2200 described above.

In operation 2302, photomasks are formed based on the GDS file. In some embodiments, the GDS file provided in operation 2301 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 2302 can be performed by a photomask manufacturer, where the circuit layout is read using a suitable software (e.g., EDA tool) and the circuit layout is transferred onto a substrate using a suitable printing/deposition tool. The photomasks reflect the circuit layout/features included in the GDS file.

In operation 2303, one or more circuits are formed based on the photomasks generated in operation 2302. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

In one aspect of the present disclosure, a semiconductor device is disclosed. The semiconductor device includes a first memory cell including a number of first gate structures, wherein the first gate structures all extend along a first lateral direction and are spaced from one another along a second lateral direction perpendicular to the first lateral direction. The semiconductor device includes a second memory cell physically disposed next to the first memory cell along the first lateral direction, and including a number of second gate structures, wherein the second gate structures all extend along the first lateral direction and are spaced from one another along the second lateral direction. The semiconductor device includes a plurality of first sets of word lines extending along the first lateral direction, each of the first sets of word lines operatively coupled to a corresponding one of the first and second memory cells and having a number (N) of word lines. The semiconductor device includes a first bit line extending along the second lateral direction, and operatively coupled to the first memory cell. The semiconductor device includes a second bit line extending along the second lateral direction, and operatively coupled to the second memory cell. A first length of the first bit line in the second lateral direction and a second length of the second bit line in the second lateral direction are each inversely proportional to the number N.

In another aspect of the present disclosure, a semiconductor device is disclosed. The semiconductor device includes a first memory cell formed in a four-contact polysilicon pitch (4CPP) architecture. The semiconductor device includes a second memory cell also formed in the 4CPP architecture and physically disposed next to the first memory cell along a first lateral direction. The semiconductor device includes a first word line extending along the first lateral direction and operatively coupled to the first memory cell. The semiconductor device includes a second word line extending along the first lateral direction and operatively coupled to the first memory cell. The semiconductor device includes a third word line extending along the first lateral direction and operatively coupled to the second memory cell. The semiconductor device includes a fourth word line extending along the first lateral direction and operatively coupled to the second memory cell. The semiconductor device includes a first bit line extending along a second lateral direction perpendicular to the first lateral direction and operatively coupled to the first memory cell. The semiconductor device includes a second bit line extending along the second lateral direction and operatively coupled to the second memory cell.

In yet another aspect of the present disclosure, a method for forming semiconductor devices is disclosed. The method includes placing, on a floorplan, a first memory cell formed in a four-contact polysilicon pitch (4CPP) architecture. The method includes placing, on the floorplan, a second memory cell next to the first memory cell along a first lateral direction and also formed in the 4CPP architecture. The method includes connecting a plurality of sets of word lines to a corresponding one of the first and second memory cells, each of the sets of word lines extending along the first lateral direction and having a plural number (N) of word lines. The method includes connecting a first bit line to the first memory cell, the first bit line extending along a second lateral direction perpendicular to the first lateral direction. The method includes connecting a second bit line to the second memory cell, the second bit line extending along the second lateral direction.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first memory cell including a number of first gate structures, wherein the first gate structures all extend along a first lateral direction and are spaced from one another along a second lateral direction perpendicular to the first lateral direction;

a second memory cell physically disposed next to the first memory cell along the first lateral direction, and including a number of second gate structures, wherein the second gate structures all extend along the first lateral direction and are spaced from one another along the second lateral direction;

a number (M) of first sets of word lines extending along the first lateral direction, each of the first sets of word lines operatively coupled to a corresponding one of the first and second memory cells and having plural word lines;

a first bit line extending along the second lateral direction, and operatively coupled to the first memory cell; and a second bit line extending along the second lateral direction, and operatively coupled to the second memory cell;

wherein a first length of the first bit line in the second lateral direction and a second length of the second bit line in the second lateral direction are each inversely proportional to the number M.

2. The semiconductor device of claim 1, further comprising:

a third bit line extending along the second lateral direction, and operatively coupled to the first memory cell; and a fourth bit line extending along the second lateral direction, and operatively coupled to the second memory cell;

wherein a third length of the third bit line in the second lateral direction and a fourth length of the fourth bit line in the second lateral direction are each inversely proportional to the number M.

3. The semiconductor device of claim 2, wherein the first bit line consists of a first bit line pair, and the second bit line consists of a second bit line pair.

4. The semiconductor device of claim 1, further comprising:

a third bit line extending along the second lateral direction, and operatively coupled to both of the first memory cell and the second memory cell;

wherein a third length of the third bit line in the second lateral direction is inversely proportional to the number M.

5. The semiconductor device of claim 4, wherein the first bit line consists of a first bit line pair, and the second bit line consists of a second bit line pair.

6. The semiconductor device of claim 1, further comprising:

a third bit line pair extending along the second lateral direction, and operatively coupled to both of the first memory cell and the second memory cell;

wherein a third length of each the third bit line pair in the second lateral direction is inversely proportional to the number M.

7. The semiconductor device of claim 1, further comprising:

a third bit line pair extending along the second lateral direction, and operatively coupled to the first memory cell;

a fourth bit line pair extending along the second lateral direction, and operatively coupled to the second memory cell;

wherein a third length of each the third bit line pair in the second lateral direction and a fourth length of each the fourth bit line pair in the second lateral direction are each inversely proportional to the number M.

8. The semiconductor device of claim 7, wherein the first bit line consists of a first bit line pair, and the second bit line consists of a second bit line pair.

9. The semiconductor device of claim 1, wherein the number M is equal to or greater than 2.

10. The semiconductor device of claim 1, wherein the first memory cell and the second memory cell each include seven transistors.

11. The semiconductor device of claim 1, wherein the first memory cell and the second memory cell each include eight transistors.

12. The semiconductor device of claim 1, further comprising:

a third memory cell disposed next to the first memory cell along the second lateral direction, and including a number of third gate structures, wherein the third gate structures all extend along the first lateral direction and are spaced from one another along the second lateral direction, and wherein the first bit line is operatively coupled to the third memory cell;

a fourth memory cell physically disposed next to the third memory cell along the first lateral direction, and including a number of fourth gate structures, wherein the fourth gate structures all extend along the first lateral direction and are spaced from one another along the second lateral direction, and wherein the second bit line is operatively coupled to the fourth memory cell; and a plurality of second sets of word lines extending along the first lateral direction, each of the second sets of word lines operatively coupled to a corresponding one of the third and fourth memory cells and having plural word lines.

13. A semiconductor device, comprising:

a first memory cell formed in a four-contact polysilicon pitch (4CPP) architecture;

a second memory cell also formed in the 4CPP architecture and physically disposed next to the first memory cell along a first lateral direction;

a first word line extending along the first lateral direction and operatively coupled to the first memory cell;

a second word line extending along the first lateral direction and operatively coupled to the first memory cell;

a third word line extending along the first lateral direction and operatively coupled to the second memory cell;

a fourth word line extending along the first lateral direction and operatively coupled to the second memory cell;

a first bit line extending along a second lateral direction perpendicular to the first lateral direction and operatively coupled to the first memory cell; and a second bit line extending along the second lateral direction and operatively coupled to the second memory cell.

14. The semiconductor device of claim 13, wherein a first length of the first bit line in the second lateral direction and a second length of the second bit line in the second lateral direction are each inversely proportional to a number of word lines operatively coupled to each of the first and second memory cells.

15. The semiconductor device of claim 13, wherein the first memory cell and the second memory cell each include a Static Random Access Memory (SRAM) cell formed of seven transistors.

16. The semiconductor device of claim 13, wherein the first memory cell and the second memory cell each include an SRAM cell formed of eight transistors.

17. The semiconductor device of claim 13, further comprising:

a fifth word line extending along the first lateral direction and operatively coupled to the first memory cell; and a sixth word line extending along the first lateral direction and operatively coupled to the second memory cell.

18. The semiconductor device of claim 13, further comprising:

a third memory cell also formed in the 4CPP architecture and physically disposed next to the first memory cell along the second lateral direction;

a fourth memory cell also formed in the 4CPP architecture and physically disposed next to the second memory cell along the second lateral direction;

a fifth word line extending along the first lateral direction and operatively coupled to the third memory cell;

a sixth word line extending along the first lateral direction and operatively coupled to the third memory cell;

a seventh word line extending along the first lateral direction and operatively coupled to the fourth memory cell; and an eighth word line extending along the first lateral direction and operatively coupled to the fourth memory cell;

wherein the first bit line is also operatively coupled to the third memory cell, and the second bit line is also operatively coupled to the fourth memory cell.

19. A method for forming semiconductor devices, comprising:

placing, on a floorplan, a first memory cell formed in a four-contact polysilicon pitch (4CPP) architecture;

placing, on the floorplan, a second memory cell next to the first memory cell along a first lateral direction and also formed in the 4CPP architecture;

connecting a plurality of sets of word lines each to a corresponding one of the first and second memory cells, each of the sets of word lines extending along the first lateral direction and having a plural number of word lines;

connecting a first bit line to the first memory cell, the first bit line extending along a second lateral direction perpendicular to the first lateral direction; and connecting a second bit line to the second memory cell, the second bit line extending along the second lateral direction.

20. The method of claim 19, wherein a first length of the first bit line in the second lateral direction and a second length of the second bit line in the second lateral direction are each inversely proportional to a number of the plurality of sets of word lines.

* * * * *